United States Patent
Brunn et al.

(10) Patent No.: US 8,346,179 B2
(45) Date of Patent: Jan. 1, 2013

(54) PUSH-PULL LOW-NOISE AMPLIFIER WITH AREA-EFFICIENT IMPLEMENTATION

(75) Inventors: Brian Brunn, Austin, TX (US); Sehat Sutardja, Los Altos Hills, CA (US); Xiaohua Fan, Austin, TX (US); Gregory Uehara, Austin, TX (US)

(73) Assignee: Marvell World Trade Ltd., St. Michael (BB)

( * ) Notice: Subject to any disclaimer, the term of this patent is extended or adjusted under 35 U.S.C. 154(b) by 245 days.

(21) Appl. No.: 12/772,654

(22) Filed: May 3, 2010

(65) Prior Publication Data

US 2010/0291881 A1    Nov. 18, 2010

Related U.S. Application Data

(60) Provisional application No. 61/177,759, filed on May 13, 2009.

(51) Int. Cl.
*H04B 1/38* (2006.01)

(52) U.S. Cl. ............. 455/73; 455/88; 455/332; 330/269

(58) Field of Classification Search ................. 455/73, 455/88, 332, 333; 330/269
See application file for complete search history.

(56) References Cited

U.S. PATENT DOCUMENTS

| | | | |
|---|---|---|---|
| 5,656,849 A | 8/1997 | Burghartz et al. | |
| 6,087,900 A | 7/2000 | Lee et al. | |
| 7,439,841 B2 * | 10/2008 | Kim | 336/200 |
| 7,528,656 B2 * | 5/2009 | Lee et al. | 330/255 |
| 2007/0290754 A1 | 12/2007 | Lee et al. | |
| 2008/0096516 A1 | 4/2008 | Mun et al. | |

OTHER PUBLICATIONS

Notification of Transmittal of the International Search Report and The Written Opinion of The International Searching Authority, or The Declaration dated Aug. 4, 2010 for application PCT/US2010/034200, 13 pgs.

* cited by examiner

*Primary Examiner* — Tuan H Nguyen

(57) ABSTRACT

An amplifier integrated circuit (IC) includes a push-pull configuration including a push stage and a pull stage. A first loop of wire is configured to form a first degeneration inductance of the push stage. A second loop of wire is configured to form a first degeneration inductance of the pull stage. The first and second loops are concentric.

13 Claims, 22 Drawing Sheets

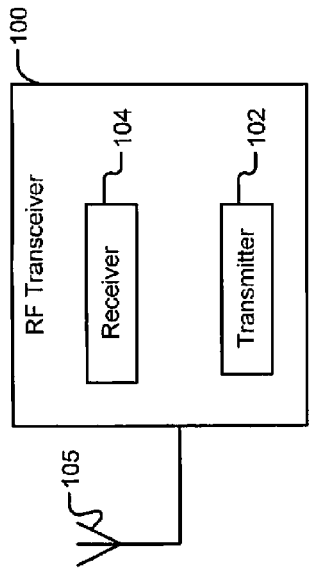
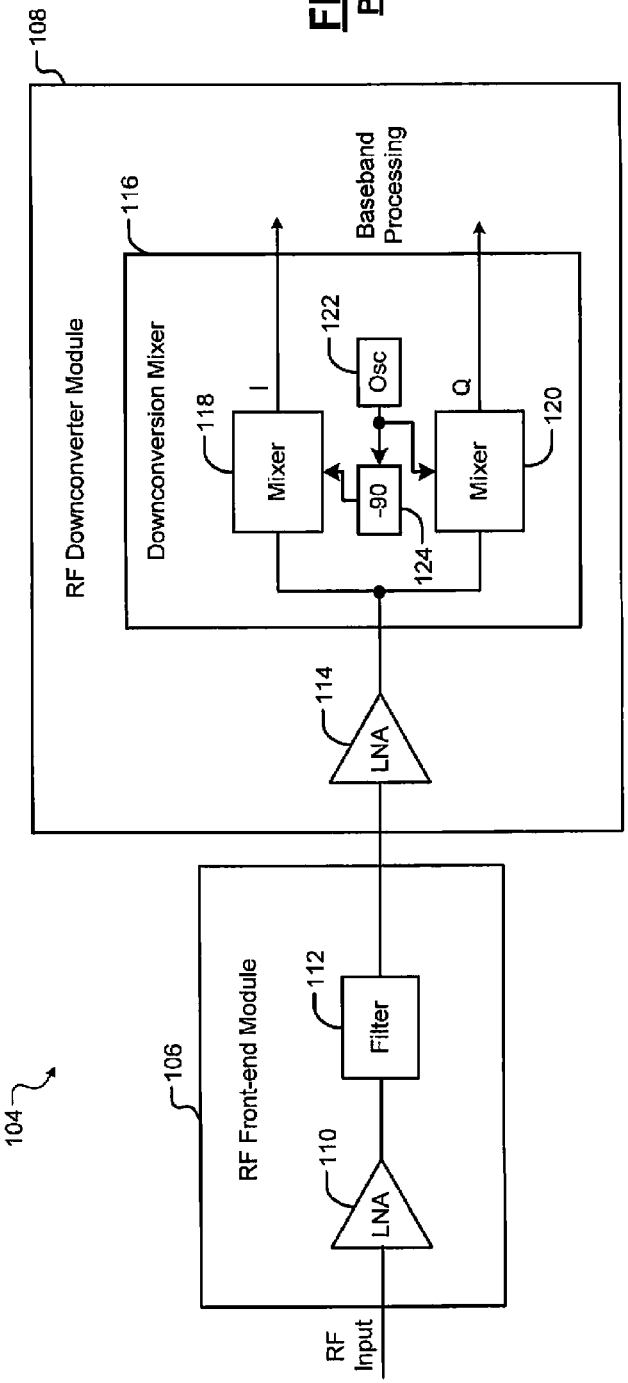

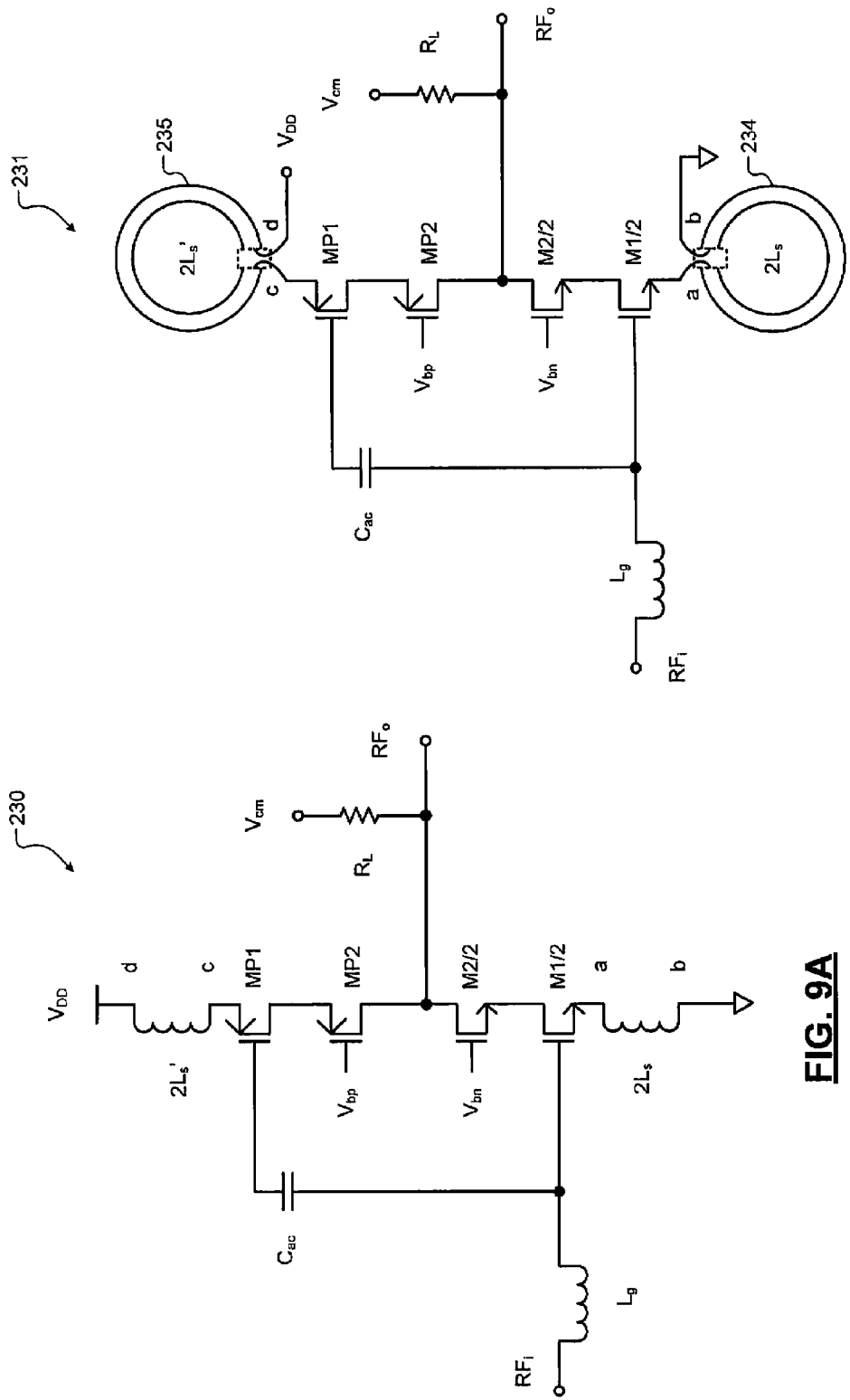

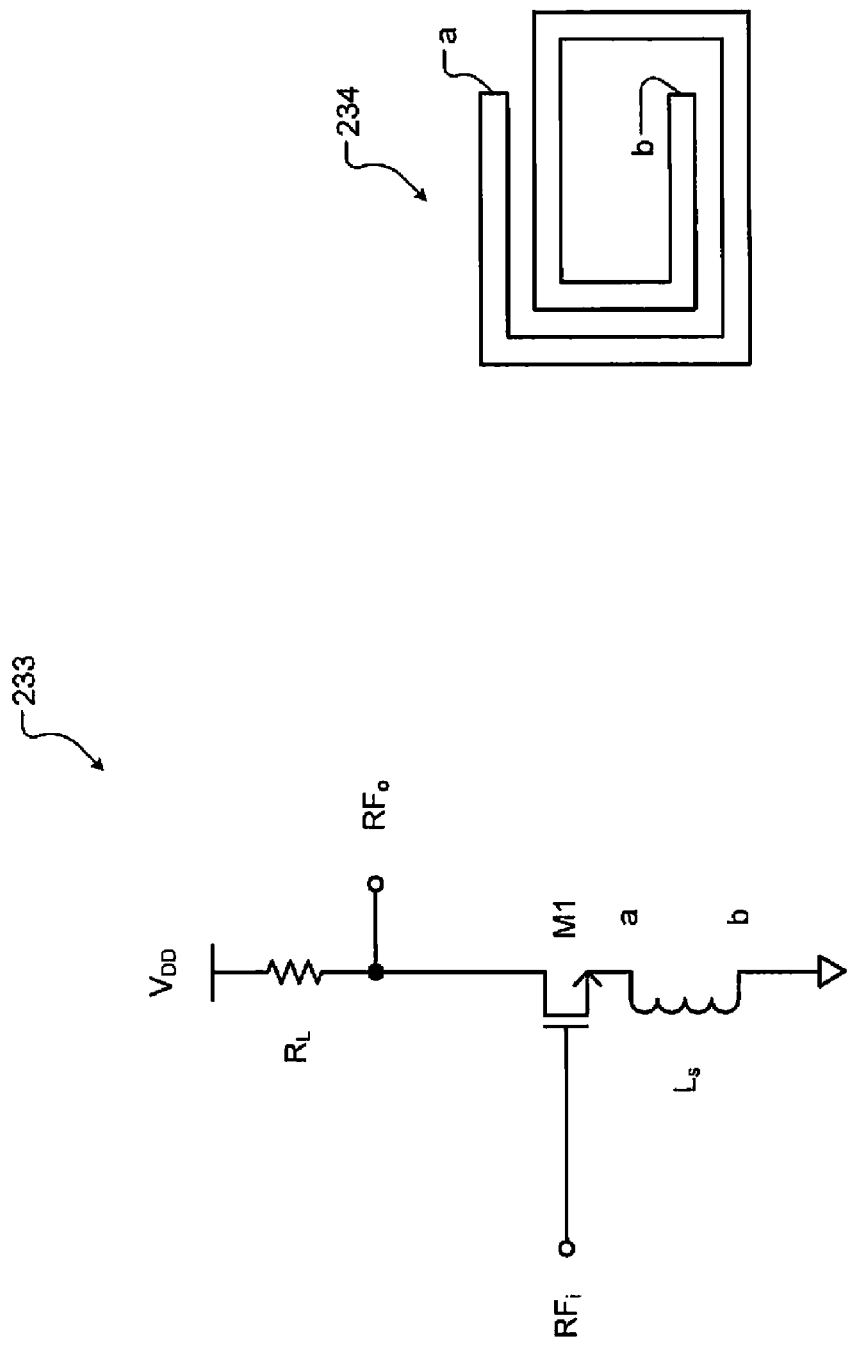

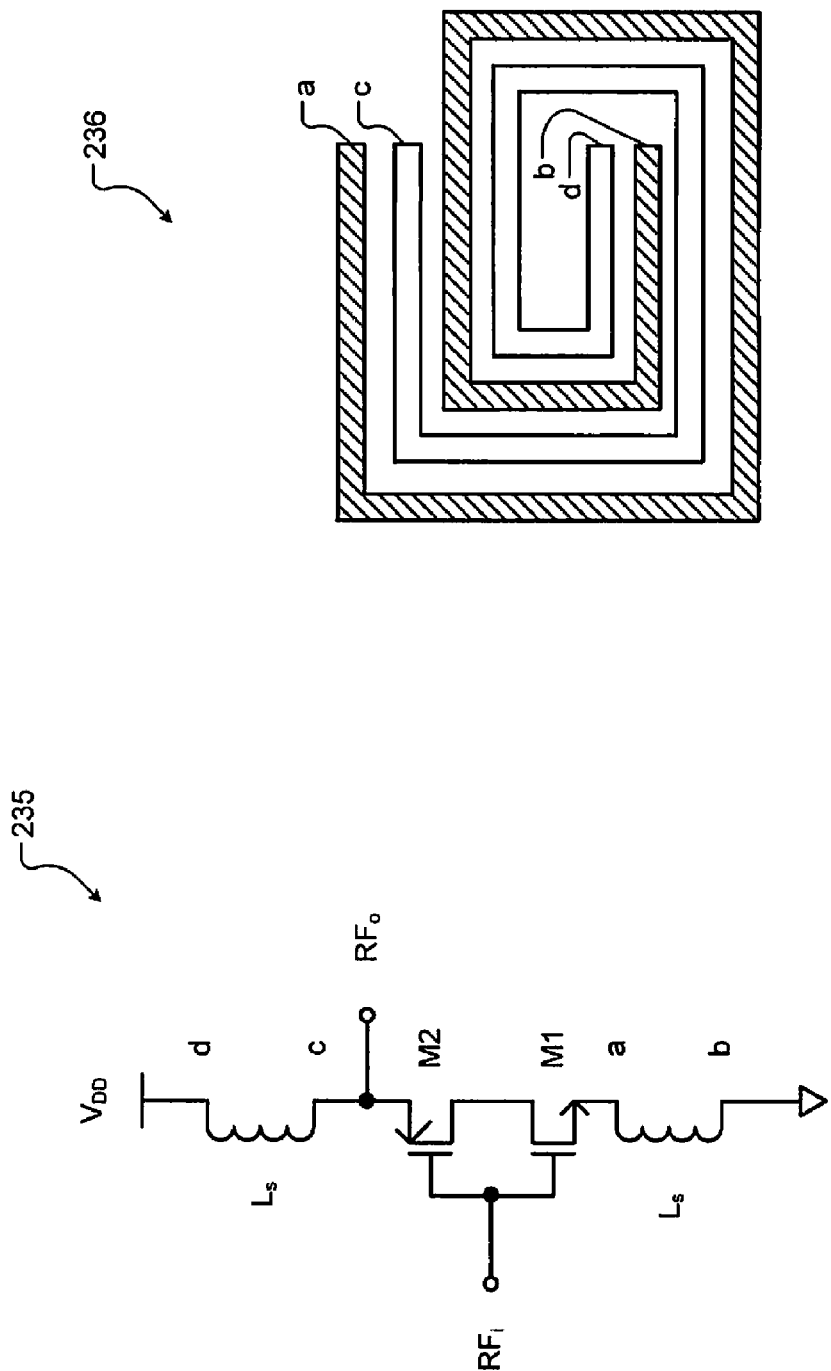

PUSH-PULL LOW-NOISE AMPLIFIER WITH AREA-EFFICIENT IMPLEMENTATION

CROSS-REFERENCE TO RELATED APPLICATIONS

This application claims the benefit of U.S. Provisional Application No. 61/177,759, filed on May 13, 2009. The disclosure of the above application is incorporated herein by reference in its entirety.

FIELD

The present disclosure relates communication devices and more particularly to push-pull low-noise amplifiers (LNAs) used in the communication devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Communication devices include cellular devices, Bluetooth® (BT) devices, global positioning system (GPS) devices, and network devices. The network devices may comply with various standards such as those set forth by the Institute of Electrical and Electronics Engineers (IEEE), the third Generation Partnership Project (3GPP), and other standards organizations. The communication devices typically transmit and receive radio frequency (RF) signals via RF transceivers. The RF transceivers may be occasionally integrated into integrated circuits (ICs) used in the devices.

Referring now to FIG. 1, a communication device comprises transceivers 12-1, 12-2, . . . , and 12-N (collectively transceivers 12), where N is an integer greater than 1. The transceivers 12 may comply with different communication standards. For example, the transceiver 12-1 may comply with the BT standard, the transceiver 12-2 may comply with the 3GPP standard, and so on. Occasionally, the communication device 10 may communicate via multiple frequency bands. Accordingly, some of the transceivers 12 may be multi-band transceivers.

Referring now to FIG. 2A, an RF transceiver 100 comprises a transmitter 102 that transmits RF signals and a receiver 104 that receives RF signals via an antenna 105. The transmitter 102 may be a super-heterodyne transmitter, a direct conversion transmitter, or other suitable transmitter. The receiver 104 may be a super-heterodyne receiver, a direct conversion receiver, or other suitable receiver.

Although a single antenna is shown, the RF transceiver 100 may transmit and receive the RF signals via a plurality of antennas. For example, the plurality of antennas may be arranged in a multiple-input multiple-output (MIMO) configuration.

Referring now to FIG. 2B, the receiver 104 typically includes an RF front-end module 106 and an RF downconverter module 108. The RF front-end module 106 typically includes a low-noise amplifier (LNA) 110 and a filter 112. The LNA 110 amplifies the RF signals received via the antenna 105. The filter 112 filters the output of the LNA 110.

The RF downconverter module 108 typically includes an LNA 114 and a downconversion mixer 116. The LNA 114 amplifies the output of the filter 112. The downconversion mixer 116 may downconvert RF signals to baseband signals using mixers 118 and 120, which are arranged in a quadrature configuration. An oscillator 122 and a 90-degree phase shifter 124 generate clock signals that clock the mixers 118 and 120, respectively. The mixers 118 and 120 generate in-phase (I) and quadrature (Q) outputs, respectively, which are input to baseband processing circuits for further processing.

Thus, transceivers typically include a plurality of LNAs. Further, multi-band transceivers typically include a plurality of LNAs per band.

SUMMARY

An amplifier integrated circuit (IC) comprises a push-pull configuration including a push stage and a pull stage. A first loop of wire is configured to form a first degeneration inductance of the push stage. A second loop of wire is configured to form a first degeneration inductance of the pull stage. The first and second loops are concentric.

In other features, the amplifier IC further comprises a first trace configured to input a first signal to the amplification stage and a second trace configured to input a second signal to the amplification stage. The first trace is adjacent and proximate to a first portion of the first loop. The second trace is adjacent and proximate to a second portion of the first loop. The second portion is arranged across from and opposite to the first portion.

In other features, the first and second loops each have a first terminal and a second terminal. The pull stage comprises a first transistor having a first terminal configured to connect to the first terminal of the first loop, a second terminal, and a control terminal. The push stage comprises a second transistor having a first terminal configured to connect to the first terminal of the second loop, a second terminal, and a control terminal. The second terminals of the first and second loops are configured to connect to a common potential and a supply voltage, respectively.

In other features, the pull stage further comprises a third transistor having a first terminal configured to connect to the second terminal of the first transistor, and a second terminal. The push stage further comprises a fourth transistor having a first terminal configured to connect to the second terminal of the third transistor, and a second terminal configured to connect to the second terminal of the second transistor.

In other features, the amplifier IC further comprises an input inductance having a first terminal configured to receive an input signal and a second terminal configured to connect to the control terminal of the first transistor. The amplifier IC further comprises a capacitance having a first terminal configured to connect to the control terminal of the first transistor and a second terminal configured to connect to the control terminal of the second transistor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 2A is a functional block diagram of a transceiver according to the prior art;

FIG. 2B is a functional block diagram of a receiver according to the prior art;

FIG. 9A is a schematic of a single-ended push-pull LNA;

FIG. 9B is a schematic of a single-ended push-pull LNA comprising two separate loops used to form inductances of amplification and push-pull stages;

FIG. 10A is a schematic of a single-ended LNA without a cascode transistor;

FIG. 10B depicts layout of a spiral inductor used to implement a source degenerating inductance when the single-ended LNA of FIG. 10A is integrated in an IC;

FIG. 10C is a schematic of a single-ended push-pull LNA without cascode transistors;

FIG. 10D depicts layout of concentric spiral inductors used to implement source degenerating inductances when the single-ended push-pull LNA of FIG. 10C is integrated in an IC;

DESCRIPTION

Figure 1:
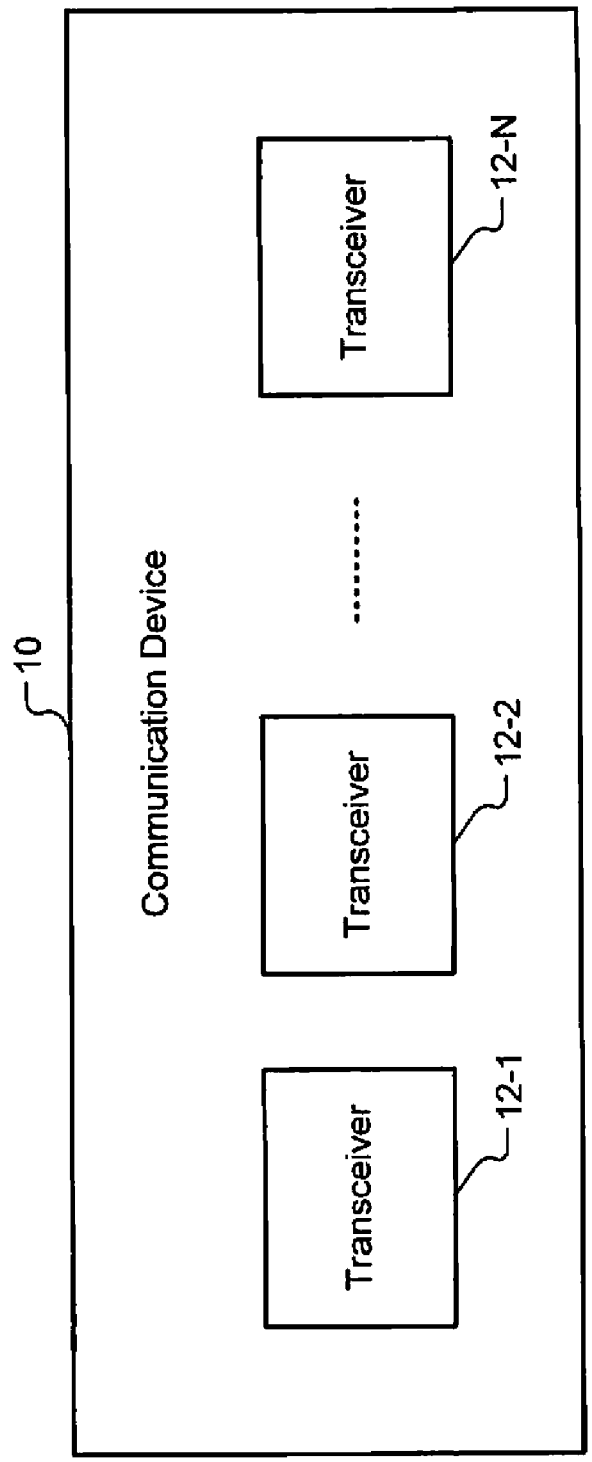
FIG. 1 is a functional block diagram of a communication device according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

Figure 3:
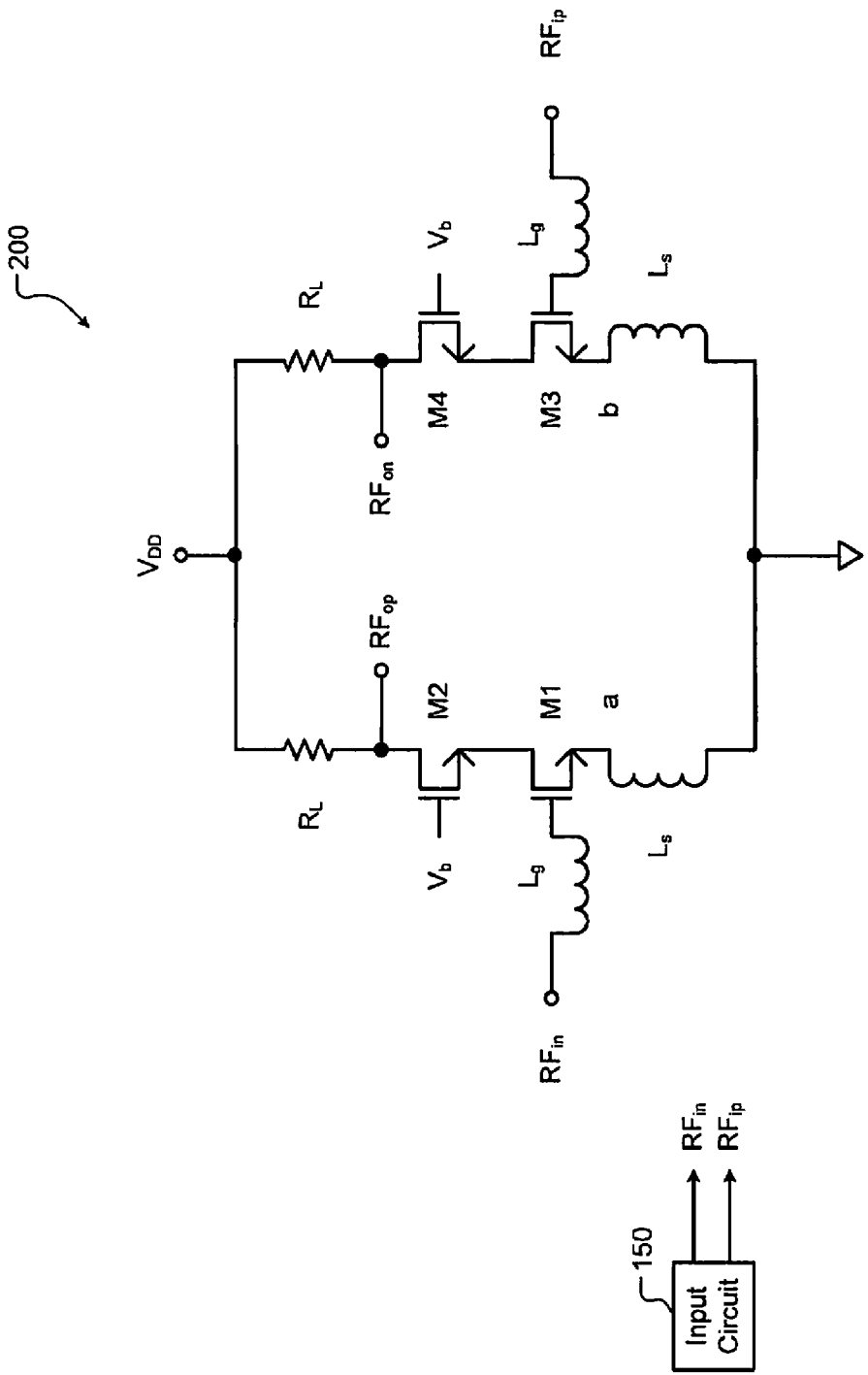
FIG. 3 is a schematic of a differential low-noise amplifier (LNA)

Referring now to FIG. 3, a low-noise amplifier (LNA) 200 is shown. For example only, the LNA 200 may be implemented using complementary metal-oxide semiconductor (CMOS) field-effect transistors (FETs). For example only, the present disclosure includes examples of LNAs that use negative MOS (NMOS) transconductance amplifiers and NMOS cascode transistors. One of ordinary skill in the art would understand, however, that the LNAs shown and described in the present disclosure may instead comprise PMOS transconductance amplifiers and PMOS cascode transistors.

In FIG. 3, for example, the LNA 200 comprises NMOS transistors M1-M4 arranged in a cascode configuration. Transistors M1 and M3 are transconductance amplifiers. The transistor M1 receives an input $RF_{in}$ (negative) via an inductance $L_g$. The transistor M3 receives an input $RF_{ip}$ (positive) via an inductance $L_g$.

An inductance $L_s$ is connected to a source of each transistor M1, M3. A resistive load $R_L$ is connected to each cascode transistor M2 and M4. Outputs $RF_{op}$ (positive) and $RF_{on}$ (negative) are generated across the resistive loads connected to the cascode transistors M2 and M4, respectively.

The LNA 200 uses inductive source degeneration to match the input impedance of the LNA 200 to an impedance of an input circuit 150 that inputs $RF_{in}$ and $RF_{ip}$ into the LNA 200. Specifically, a transconductance ($g_m$) of the transistors M1 and M3 and a reactance of the inductances $L_s$ generate the input impedance of the LNA 200. A real component of the input impedance approximately matches the impedance of the input circuit 150 that inputs $RF_{in}$ and $RF_{ip}$ into the LNA 200. Accordingly, the inductances $L_s$ are called source degenerating inductances.

When the LNA 200 is integrated in an integrated circuit (IC) in differential form, the source degenerating inductances $L_s$ are implemented as a loop of wire having an inductance of $2L_s$. The loop may include one or more turns of wire. The loop has a center tap and ports a and b that connect to points a and b of the LNA 200, respectively.

Figure 4:
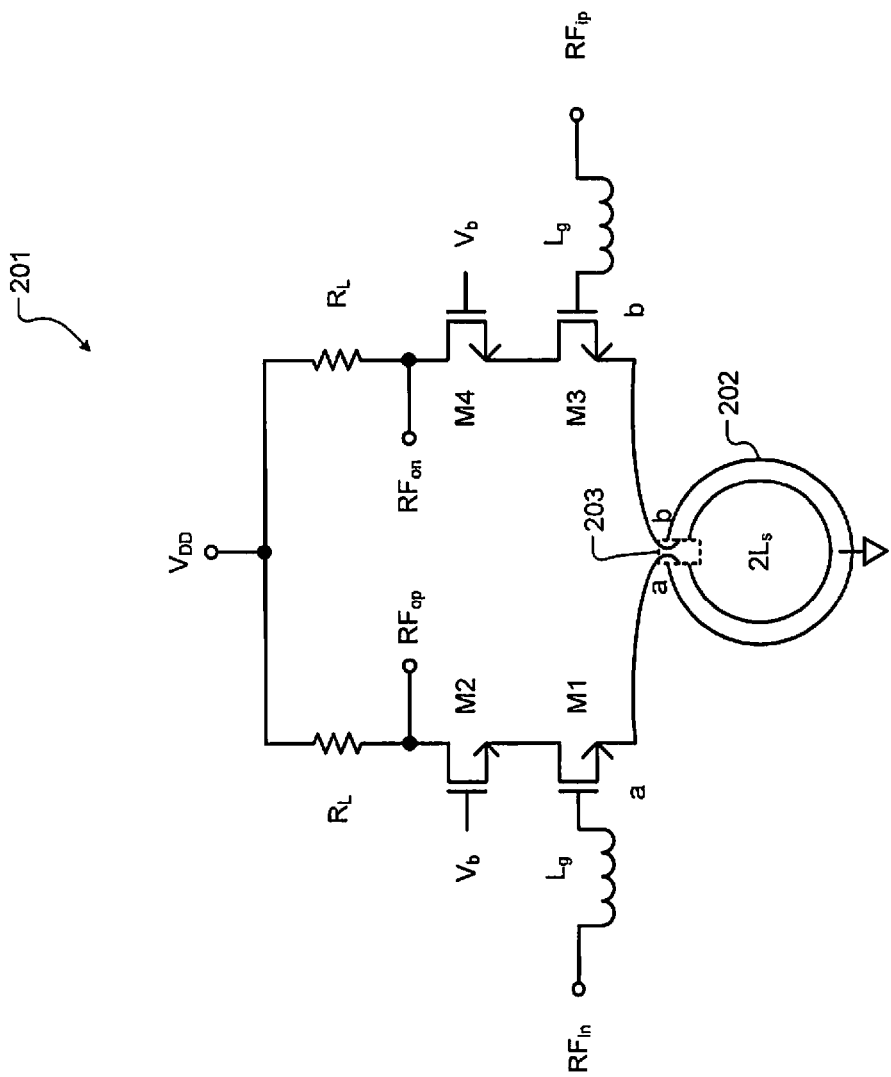
FIG. 4 is a schematic of a differential LNA comprising an inductance formed using a loop of wire.

Referring now to FIG. 4, an LNA 201 that may be integrated into an IC is shown. The LNA 201 differs from the LNA 200 of FIG. 3 in at least one respect. In the LNA 201, the source degenerating inductances $L_s$ of the LNA 200 are implemented as a loop 202 of wire having an inductance of $2L_s$. The loop 202 may include one or more turns of wire. The loop 202 has a center tap 203 and ports a and b that connect to points a and b of the LNA 201, respectively. The loop 202 is connected to a common potential as shown. Accordingly, the inductance across the source of each of the transistors M1 and M3 and the common potential is $L_s$.

Typically, a transceiver may comprise a plurality of LNAs. For example, the RF front-end module and the RF downconverter module of the transceiver may each comprise an LNA. Each LNA may comprise a loop. When the transceiver is integrated in an IC, the loops of the LNAs occupy a large area of the IC.

Additionally, the LNAs are generally input amplifiers (i.e., amplifiers used in input stages of the transceiver). Accordingly, the LNAs do not use a push-pull configuration that is typically used in output amplifiers (i.e., amplifiers used in output stages). For example, the push-pull configuration is typically used in power amplifiers such as class A and class B amplifiers used in output stages. The push-pull configuration, however, increases efficiency and decreases power consumption of amplifiers. Accordingly, without the push-pull configuration, the LNAs have lower efficiency and higher power consumption.

The present disclosure relates to high-efficiency and area-efficient LNAs. Specifically, the LNAs use the push-pull configuration to increase the efficiency of the LNAs. Particularly, the power consumption of the LNAs is reduced since the LNAs with the push-pull configuration use only half the current used by conventional LNAs. Further, the gains in efficiency and power consumption are achieved without substantially trading off linearity and noise levels of the LNAs.

Additionally, the LNAs according to present disclosure use an area-efficient implementation of inductors that reduces the area occupied by the loops in ICs. The area-efficient implementation is further optimized (i.e., area of inductor layout is further reduced) by coupling input lines of the LNAs to the inductors.

The present disclosure is organized as follows. In FIGS. 5A-5D, the push-pull configuration of the LNAs is shown in further detail. In FIGS. 6-8, the area-efficient implementation of inductors in differential LNAs is shown. In FIGS. 9A-11C, area-efficient implementation of inductors in single-ended LNAs is shown. In FIGS. 12-17, the area of inductor layout is further reduced by coupling input lines of the LNAs to the inductors.

Figure 5B:
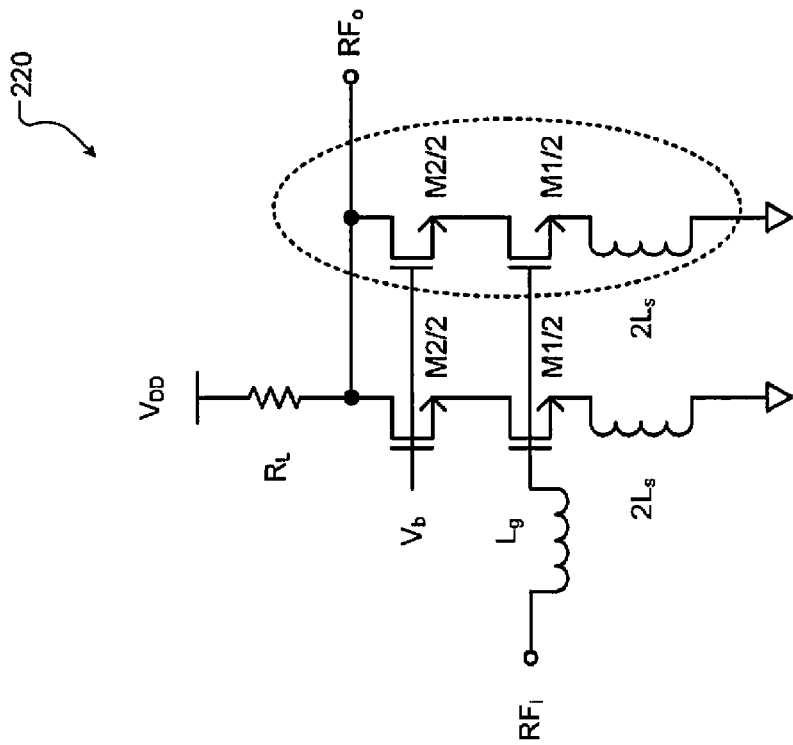
FIG. 5A-5D depict building blocks of single-ended and differential push-pull LNAs.
Figure 5A:
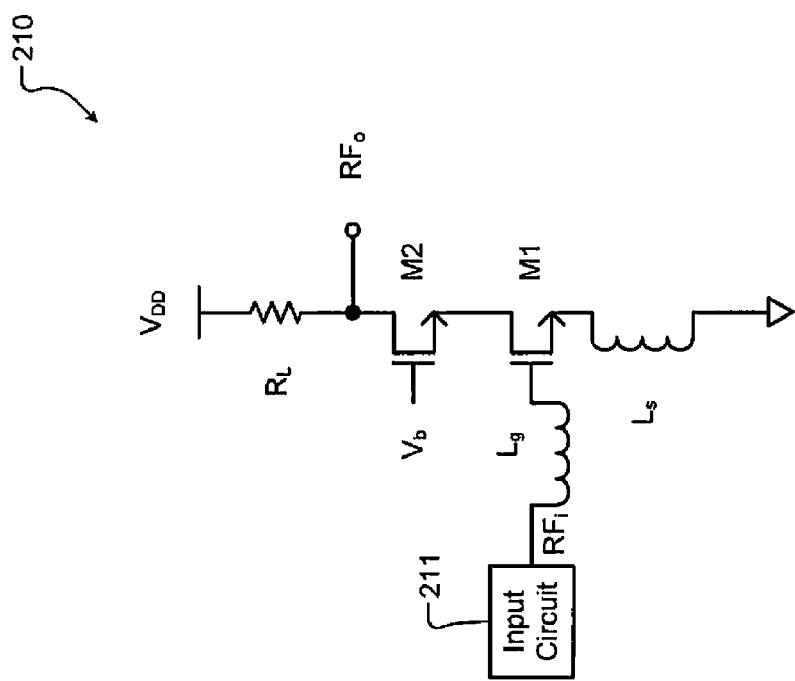
Figure 5C:
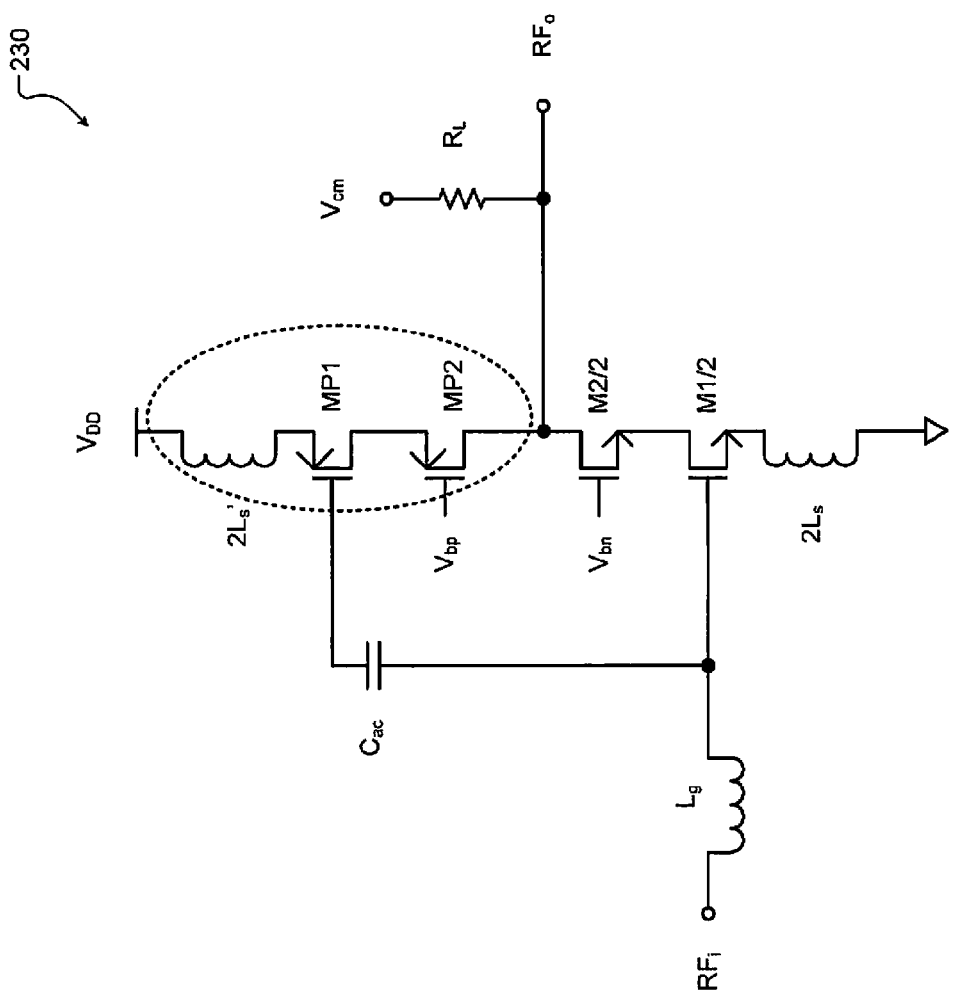
Figure 5D:
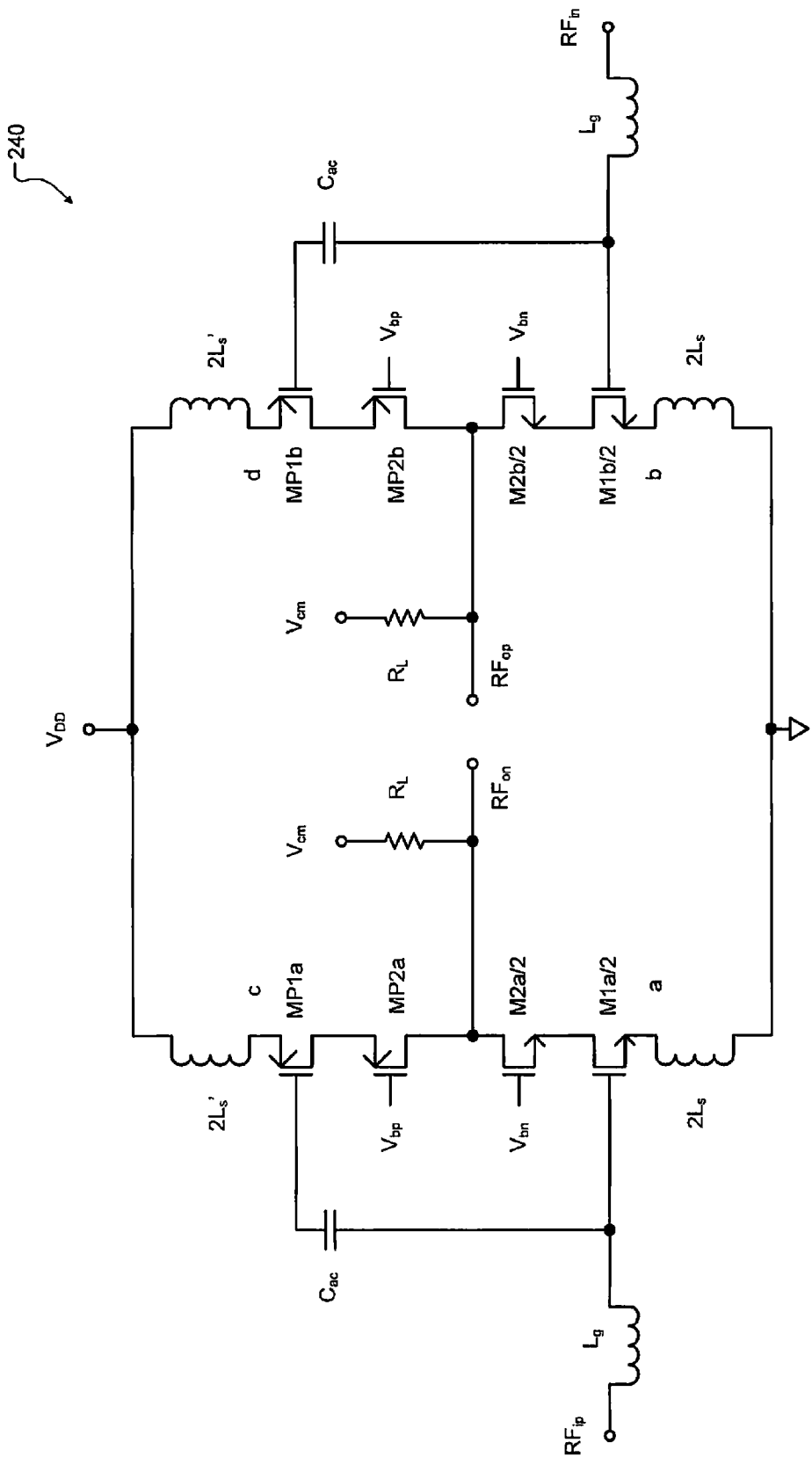
Figure 6:
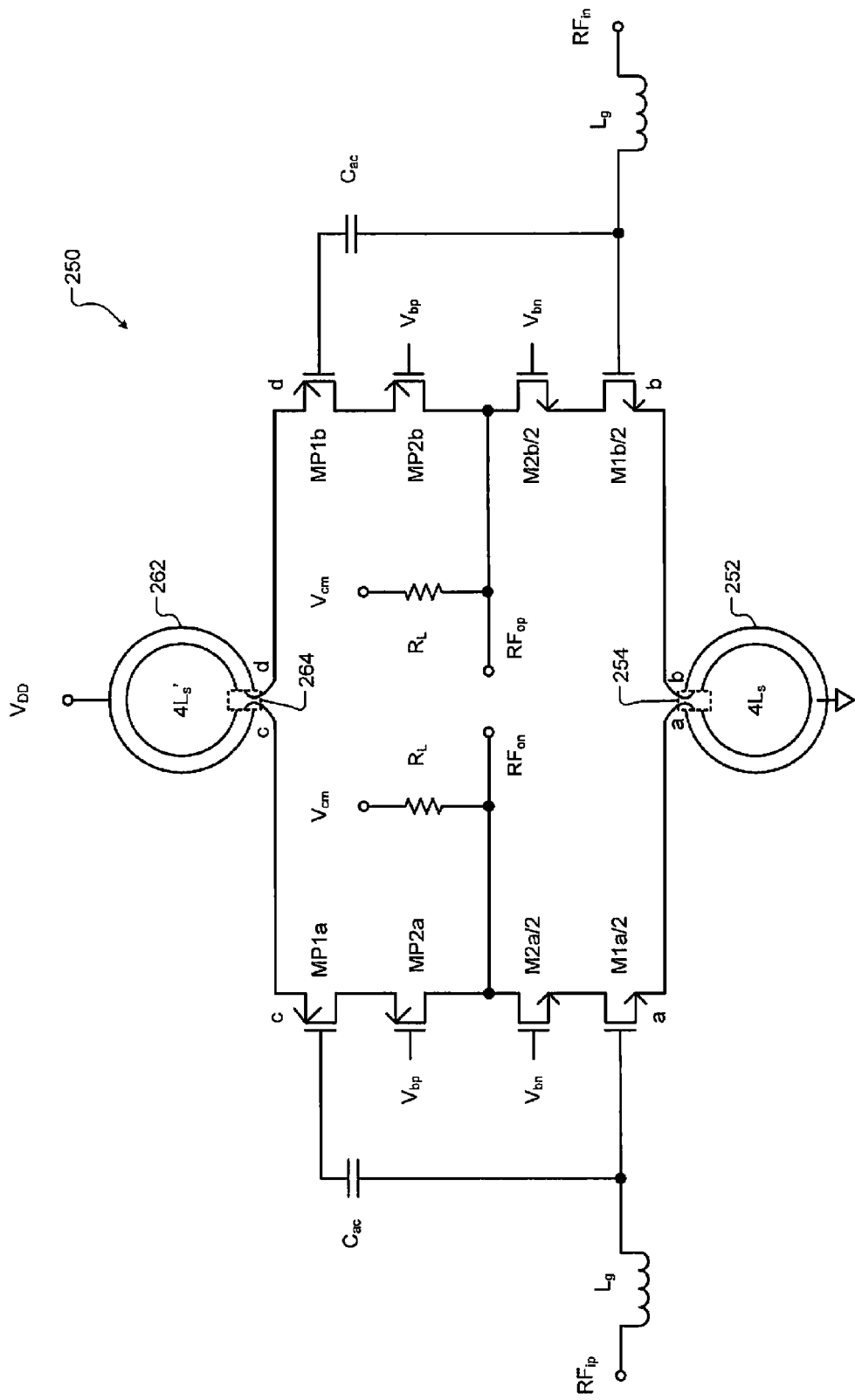
FIG. 6 is a schematic of a differential push-pull LNA comprising two separate loops used to form inductances of amplification and push-pull stages.

Referring now to FIGS. 5A-5D, building blocks of single-ended and differential push-pull LNAs are shown. In FIG. 5A, a single-ended LNA 210 is shown. In FIG. 5B, the single-ended LNA 210 is split into two parallel sections forming an LNA 220. In FIG. 5C, one of the sections of the amplifier of FIG. 5B is converted from NMOS to PMOS forming a single-ended push-pull LNA 230. In FIG. 5D, a differential push-pull LNA 240 is formed using the single-ended push-pull LNA 230 of FIG. 5C.

In FIG. 5A, the single-ended LNA 210 comprises NMOS transistors M1 and M2 arranged in a cascode configuration. The transistor M1 is a transconductance amplifier and receives an input $RF_i$ via an inductance $L_g$. A source degenerating inductance $L_s$ is connected to a source of the transistor M1. A resistive load $R_L$ is connected to a cascode transistor M2. A bias voltage $V_b$ biases the cascade transistor M2. An output $RF_o$ is generated across the resistive load $R_L$.

The single-ended LNA 210 uses inductive source degeneration to match the input impedance of the single-ended LNA 210 to an impedance of an input circuit 211 that inputs $RF_i$ into the single-ended LNA 210. Specifically, the transconductance ($g_m$) of the transistor M1 and the reactance of the source degenerating inductance $L_s$ generate the input impedance of the single-ended LNA 210. A real component of the input impedance approximately matches the impedance of the input circuit 211 that inputs $RF_i$ into the single-ended LNA 210.

In FIG. 5B, the single-ended LNA 210 is split into two sections, and the two sections are connected in parallel to form the LNA 220. Thus, the LNA 220 essentially comprises two sections of the single-ended LNA 210. The inductances $2L_s$ connected to each source of transistors M1/2 effectively form a parallel combination with a net inductance of $L_s$.

In FIG. 5C, the section of the LNA 220 identified by a dotted oval is converted from NMOS to PMOS. The PMOS section is connected to the NMOS section as shown to form the single-ended push-pull LNA 230. The PMOS section may be called a push stage, and the NMOS section may be called a pull stage of the single-ended push-pull LNA 230.

A bias voltage $V_{bn}$ is used to bias the NMOS transistor M2/2, which is the cascade transistor of the NMOS section. A bias voltage $V_{bp}$ is used to bias the PMOS transistor MP2, which is the cascade transistor of the PMOS section. An AC coupling capacitor $C_{ac}$ is used to couple the input $RF_i$ to the PMOS transistor MP1, which is the transconductance amplifier of the PMOS section.

The NMOS section includes a source degenerating inductance $2L_s$ connected to the source of the NMOS transistor M1/2. The PMOS section includes a source degenerating inductance $2L_s'$ connected to the source of the PMOS transistor MP1. The source degenerating inductances $2L_s$ and $2L_s'$ may be equal or approximately equal. The NMOS transistor M1/2 and the PMOS transistor MP1 may each have a transconductance ($g_m$). The input impedance generated by the $g_m$ of MP1 and the reactance of $2L_s'$ is the same as the input impedance generated by the $g_m$ of M1/2 and the reactance of $2L_s$.

The single-ended push-pull LNA 230 comprises two source degenerating inductances each having twice the source degenerating inductance of the single-ended LNA 210. Accordingly, when the single-ended push-pull LNA 230 is used in an IC, the source degenerating inductances of the single-ended push-pull LNA 230 occupy more area of the IC than the source degenerating inductance of the single-ended LNA 210.

In FIG. 5D, the differential push-pull LNA 240 is formed using the single-ended push-pull LNAs 230. The two PMOS sections of the differential push-pull LNA 240 comprising transistors MP1a, MP2a, MP1b, and MP2b may be called a push stage of the differential push-pull LNA 240. The two NMOS sections of the differential push-pull LNA 240 comprising transistors M1a/2, M2a/2, M1b/2, and M2b/2 may be called a pull stage of the differential push-pull LNA 240.

The differential push-pull LNA 240 comprises four source degenerating inductances: two inductances of value $2L_s$ and two inductances of value $2L_s'$. Accordingly, when the differential push-pull LNA 240 is used in an IC, the source degenerating inductances of the differential push-pull LNA 240 occupy more area of the IC than the source degenerating inductance of the single-ended push-pull LNA 230.

Referring now to FIG. 6, a differential push-pull LNA 250 includes a first implementation of inductances. The differential push-pull LNA 250 differs from the differential push-pull LNA 240 of FIG. 5D in at least one respect. In the differential push-pull LNA 250, the two inductances each of value $2L_s$ connected to the sources of transconductance amplifiers M1a/2 and M1b/2 are implemented as a loop 252 having an inductance of $4L_s$. The loop 252 may include one or more turns of wire. The loop 252 has a center tap 254 and ports a and b that connect to points a and b of the differential push-pull LNA 250, respectively. The loop 252 is connected to a common potential as shown. Accordingly, the inductance across the source of each of the transistors M1a/2 and M1b/2 and the common potential is $2L_s$.

Additionally, in the differential push-pull LNA 250, the two inductances each of value $2L_s'$ connected to the sources of transconductance amplifiers MP1a/2 and MP1b/2 are implemented as a loop 262 having an inductance of $4L_s'$. The inductances $4L_s$ and $4L_s'$ may be equal or approximately equal. The loop 262 may include one or more turns of wire. The loop 262 has a center tap 264 and ports c and d that connect to points c and d of the differential push-pull LNA 250, respectively. The loop 262 is connected to a supply voltage $V_{DD}$ as shown. Accordingly, the inductance across the source of each of the transistors MP1a/2 and MP1b/2 and the supply voltage $V_{DD}$ is $2L_s'$. The inductances $2L_s$ and $2L_s'$ may be equal or approximately equal.

The differential push-pull LNA 250 uses only about half the current used by the LNA 201 of FIG. 4. Accordingly, the differential push-pull LNA 250 consumes less power than the LNA 201 of FIG. 4. Additionally, the linearity and noise levels of the differential push-pull LNA 250 are substantially the same as the linearity and noise levels of the LNA 201. When integrated in an IC, however, the differential push-pull LNA 250, which uses two loops 252 and 262, occupies a larger area of the IC than the LNA 201.

Referring now to FIG. 7A-7D, the area occupied by an LNA in an IC can be reduced by using a second implementation of inductances as follows. The second implementation includes cutting or slicing a loop that is used to implement an inductance into two halves. The wire used to form the loop is sliced along the length of the wire. For example, the wire may be sliced at the center. The resulting two halves are concentric and separate from each other. Each half loop has the same or approximately the same inductance as the whole loop.

Accordingly, a single loop having an inductance L, when cut into two concentric halves, may be used as two loops each having the inductance L. Thus, one of the two loops 252 and 262 of the differential push-pull LNA 250 may be eliminated, and the area occupied by the differential push-pull LNA 250 in an IC may be reduced.

Figure 7A:
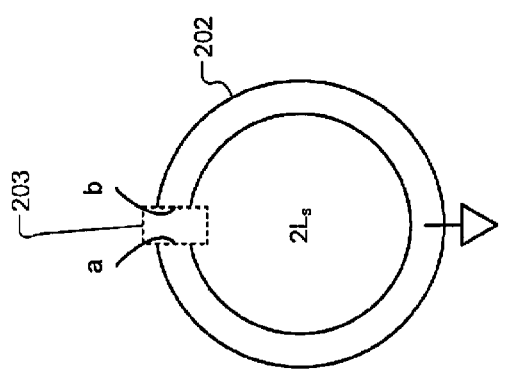
FIGS. 7A-7D depict an area-efficient implementation of inductances that is used when push-pull LNAs are integrated in integrated circuits (ICs)
Figure 7B:
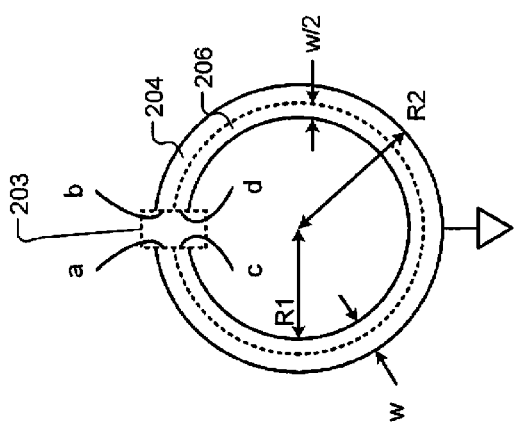
Figure 8:
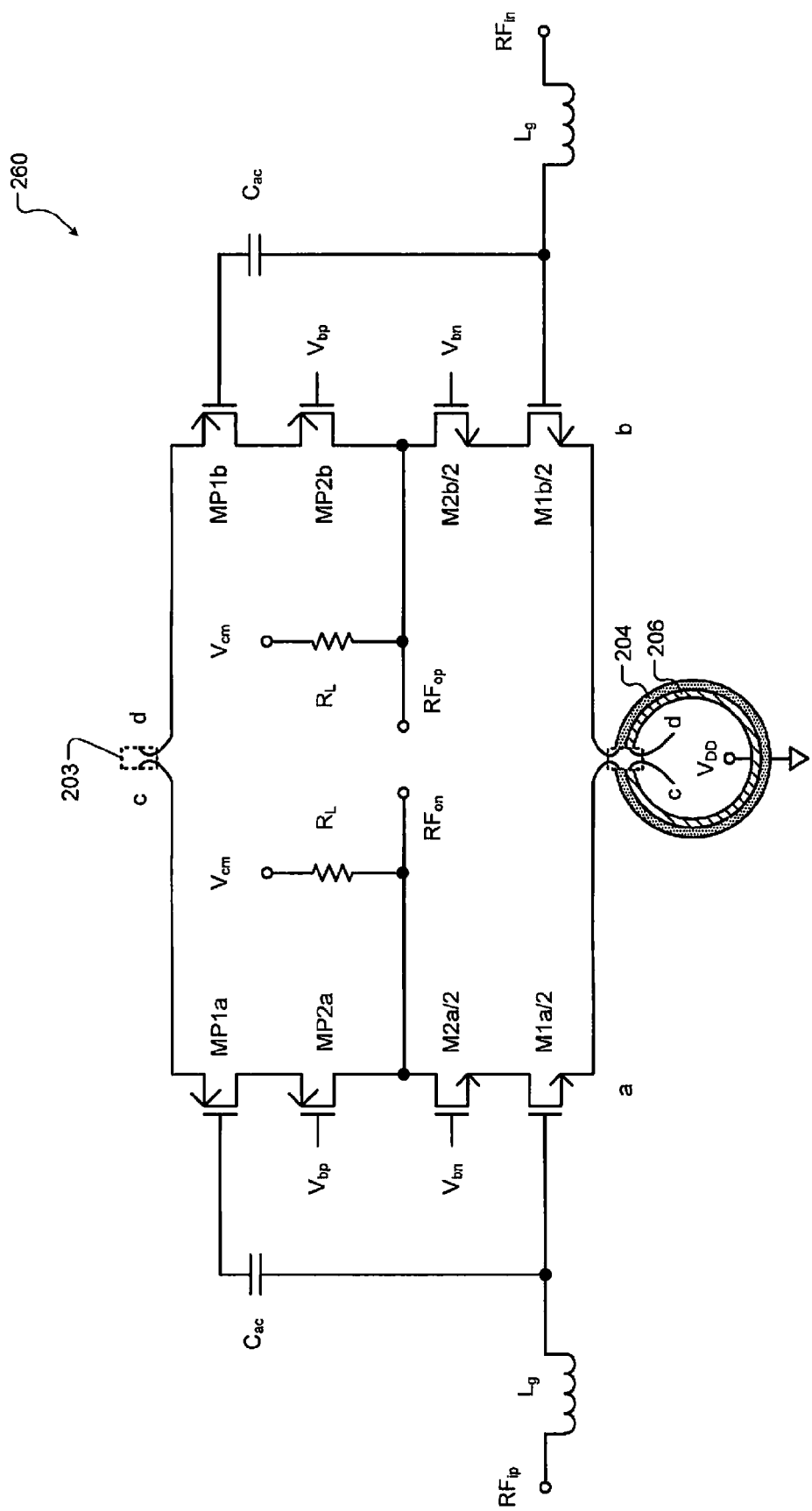
FIG. 8 is a schematic of a differential push-pull LNA comprising the area-efficient implementation of inductances.

In FIG. 7A, for example, the loop 202 having an inductance $2L_s$ is shown. In FIG. 7B, the loop 202 is sliced into half as shown by a dotted circle. A wire of width W that is used to form the loop 202 may be sliced along the length of the wire. The wire may be sliced at the center of the width so that the resulting halves (concentric loops) 204 and 206 each have a width of W/2.

For example, the loop 202 formed using the wire may have an outer radius R1 and an inner radius R2. The width W of the wire may be defined as W=(R1−R2). The loop 202 may be sliced along the length of the wire at the center of the width W so that the resulting concentric loops 204 and 206 each have a width of W/2.

The loop 202 is shown to be circular in shape for example only. Other shapes are contemplated. A non-exclusive list of the other shapes includes ovals, triangles, quadrangles, and polygons.

When the loop 202 having an inductance $2L_s$ is sliced into half as described, the resulting concentric loops 204 and 206 each have the inductance $2L_s$. This is because changing the width/diameter of the wire by slicing the wire into half does not change or only slightly changes the inductance of the concentric loops 204 and 206. Changing the width changes only a parasitic resistance of the resulting concentric loops 204 and 206.

One of the concentric loops 204 and 206 may be connected to the nodes a and b while the other half may be connected to the nodes c and d of the differential push-pull LNA 250 of FIG. 6. When the concentric loops 204 and 206 are separated by a small space, no current (DC or AC) flows across the dotted line (i.e., from one half to another and vice versa). Accordingly, when the concentric loops 204 and 206 are separated by a small space, each half can be at a different DC potential. An AC potential difference between the nodes a and b, however, can be and is the same as the AC potential difference between the nodes c and d. Thus, while the DC properties of the concentric loops 204 and 206 can be varied, the RF properties of the concentric loops 204 and 206 are the same as the RF properties of the loop 202.

Figure 7D:
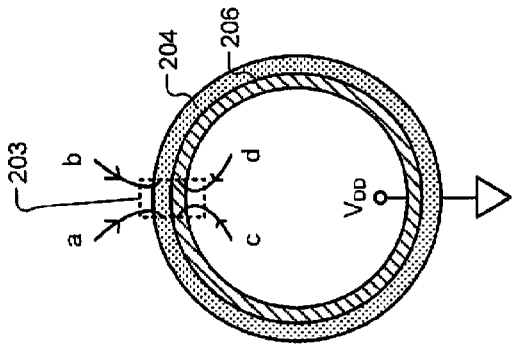
Figure 7C:
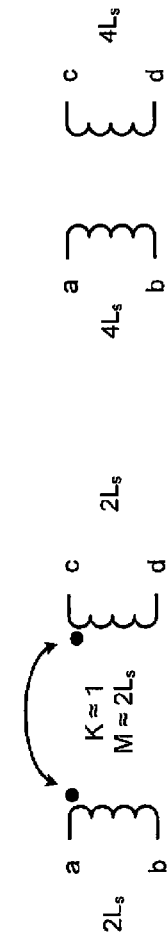

In FIG. 7C, the concentric loops 204 and 206 are shown in a schematic form. Accordingly, the doted circle is omitted. Each of the concentric loops 204 and 206 has an inductance of $2L_s$. Further, a coupling coefficient K of the concentric loops 204 and 206 is approximately 1 (i.e., K≈1). Additionally, a mutual inductance of the concentric loops 204 and 206 is approximately $2L_s$. Thus, the concentric loops 204 and 206 each have an effective inductance of $4L_s$.

Accordingly, the concentric loops 204 and 206 can be connected to the nodes a-d of the differential push-pull LNA 250 as shown in FIG. 7D. The outer and inner concentric loops 204 and 206 may be connected to the common potential and the supply voltage $V_{DD}$ as shown, respectively. A DC current flows into the differential push-pull LNA 250 via the nodes c and d and returns via the nodes a and b as shown.

Referring now to FIG. 8, a differential push-pull LNA 260 comprises the concentric loops 204 and 206. Similar to the differential push-pull LNA 250, the differential push-pull LNA 260 uses only half the current used by the LNA 201 of FIG. 4. Accordingly, the differential push-pull LNA 260 consumes less power than the LNA 201 of FIG. 4. Additionally, the linearity and noise levels of the differential push-pull LNA 260 are substantially the same as the linearity and noise levels of the LNA 201 and of the differential push-pull LNA 250.

The differential push-pull LNA 260, however, differs from the differential push-pull LNA 250 in at least one respect. When integrated in an IC, the differential push-pull LNA 260, which uses two concentric loops 204 and 206, occupies less area of the IC than the differential push-pull LNA 250, which uses two separate loops 252 and 262.

Throughout the present disclosure, differential implementations of the LNAs are shown for example only. The teachings of the present disclosure can also be applied to single-ended LNAs. Accordingly, similar gains in area and power consumption can be achieved without trading off linearity and noise in single-ended LNAs.

Figure 9C:
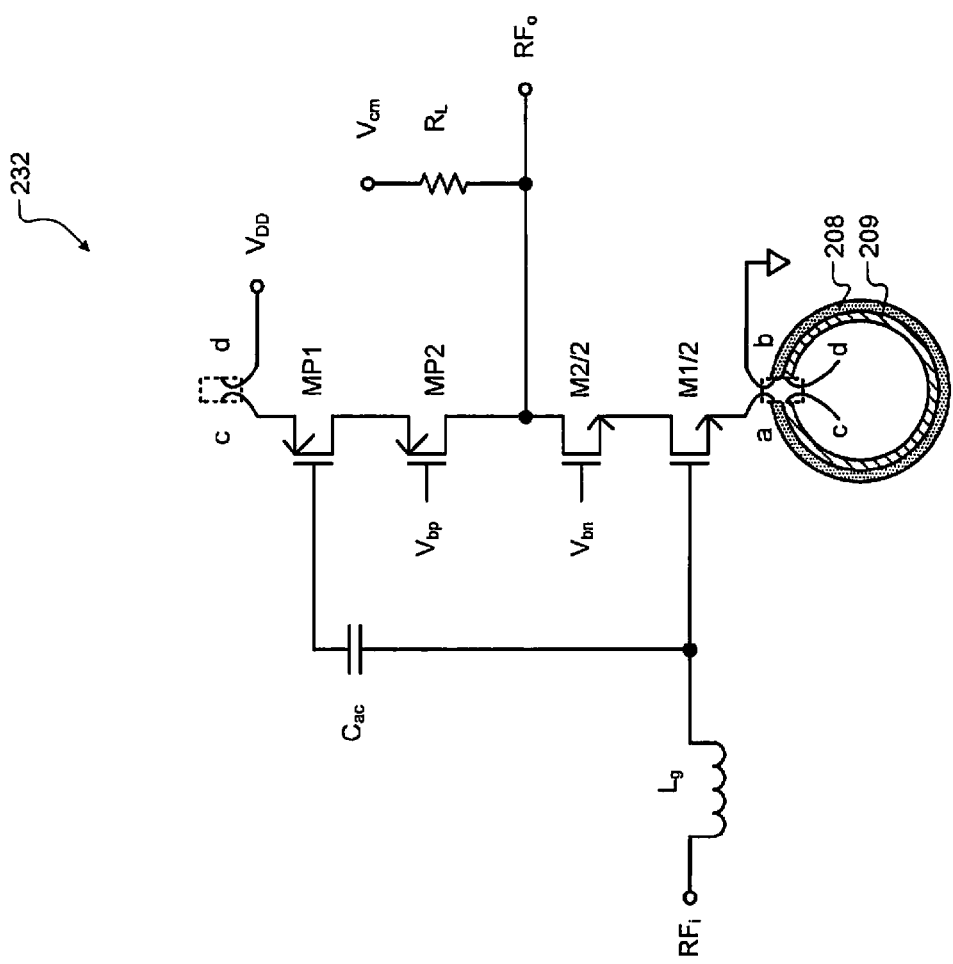
FIG. 9C is a schematic of a single-ended push-pull LNA comprising the area-efficient implementation of inductances.

Referring now to FIGS. 9A-9C, for example, a single-ended push-pull LNA according to the present disclosure is shown. In FIG. 9A, the single ended push-pull LNA 230 of FIG. 5C is redrawn for convenience. In FIG. 9B, a single ended push-pull LNA 231 uses two separate loops 234 and 235 having inductances $2L_s$ and $2L_s'$ to implement the inductances $2L_s$ and $2L_s'$, respectively.

In FIG. 9C, a single ended push-pull LNA 232 uses concentric loops 208 and 209 according to the present disclosure. The concentric loops 208 and 209 replace the inductances $2L_s$ and $2L_s'$ shown in FIG. 9A and the loops 234 and 235 shown in FIG. 9B. The concentric loops 208 and 209 are formed by slicing a loop having an inductance $L_s$ as explained with reference to FIGS. 7A-7D. As explained with reference to FIGS. 7A-7D, the effective inductance of the concentric loops 208 and 209 is $2L_s$.

The single-ended push-pull LNAs 230, 231, and 232 use only about half the current used by the single-ended LNA 210 of FIG. 5A. Accordingly, the single-ended push-pull LNAs 230, 231, and 232 consume less power than the single-ended LNA 210 of FIG. 5A. Additionally, the linearity and noise levels of the single-ended push-pull LNAs 230, 231, and 232 are substantially the same as the linearity and noise levels of the single-ended LNA 210.

The single-ended push-pull LNA 232, however, differs from the single-ended push-pull LNA 231 in at least one respect. When integrated in an IC, the single-ended push-pull LNA 232, which uses two concentric loops 208 and 209, occupies less area of the IC than the single-ended push-pull LNA 230, which uses two loops 234 and 235.

Referring now to FIGS. 10A-10E, spiral inductors may be used to implement source degenerating inductances of single-ended LNAs. For simplicity of illustration, the single-ended LNAs are shown without the cascode configuration. One of ordinary skill in the art will understand, however, that the cascode configuration can be used with the single-ended LNAs as shown in FIGS. 9A-9C, for example.

In FIG. 10A, a single-ended LNA 233 without cascode configuration is shown. In FIG. 10B, a spiral inductor 234 is shown. When the single-ended LNA 233 is integrated in an IC, the source degenerating inductance $L_s$ of the single-ended LNA 233 is implemented using the spiral inductor 234 to save space in the IC.

Figure 10E:
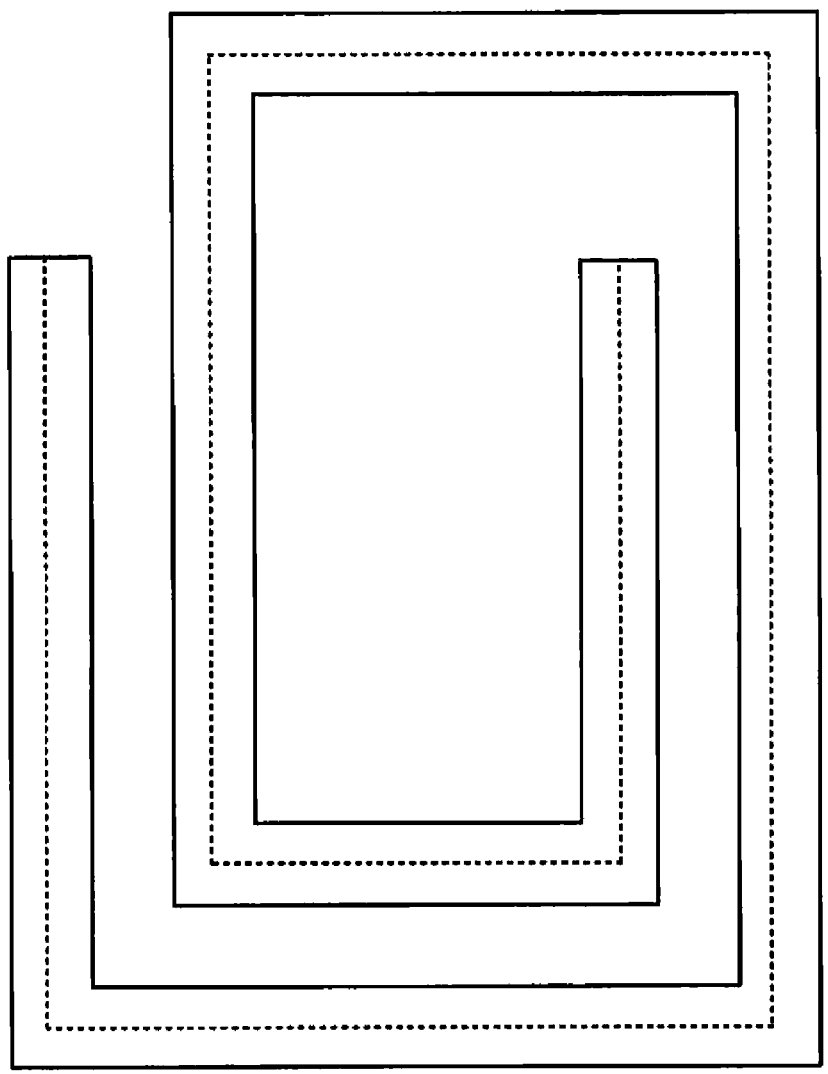
FIG. 10E depicts formation of the concentric spiral inductors of FIG. 10D by slicing the spiral inductor of FIG. 10B.

In FIG. 10C, a single-ended push-pull LNA 235 without cascode configuration is shown. In FIG. 10D, a concentric spiral inductor 236 is shown. The concentric spiral inductor 236 may be formed by slicing the spiral inductor 234 as shown in FIG. 10E. When the single-ended push-pull LNA 235 is integrated in an IC, the source degenerating inductances $L_s$ of the single-ended push-pull LNA 235 are implemented using the concentric spiral inductor 236 to save space in the IC.

Figure 11A:
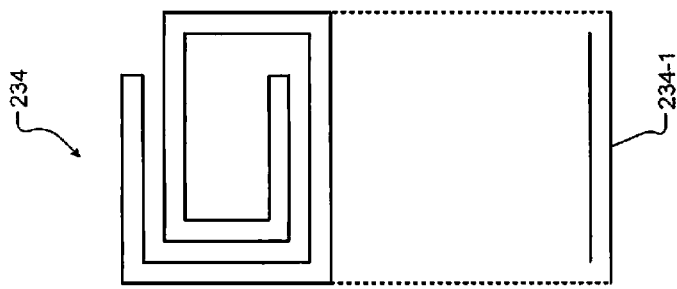
FIGS. 11A-11C depict examples of different shapes of the spiral inductors shown in FIGS. 10B, 10D, and 10E.
Figure 11C:
Figure 11B:

Referring now to FIGS. 11A-11C, the spiral inductors shown in FIGS. 10B, 10D, and 10E can have other shapes. For example, portions of the spiral inductors, such as a portion 234-1 of the spiral inductor 234 shown in FIG. 11A, can be bent at various angles as shown in FIG. 11B. For example only, FIG. 11B shows that a portion of the inductor is bent at one place. The portion, however, can be bent at more than one place. Alternatively, portions of the spiral inductors can be curved as shown in FIG. 11C. Still other shapes and configurations are contemplated.

Figure 12:
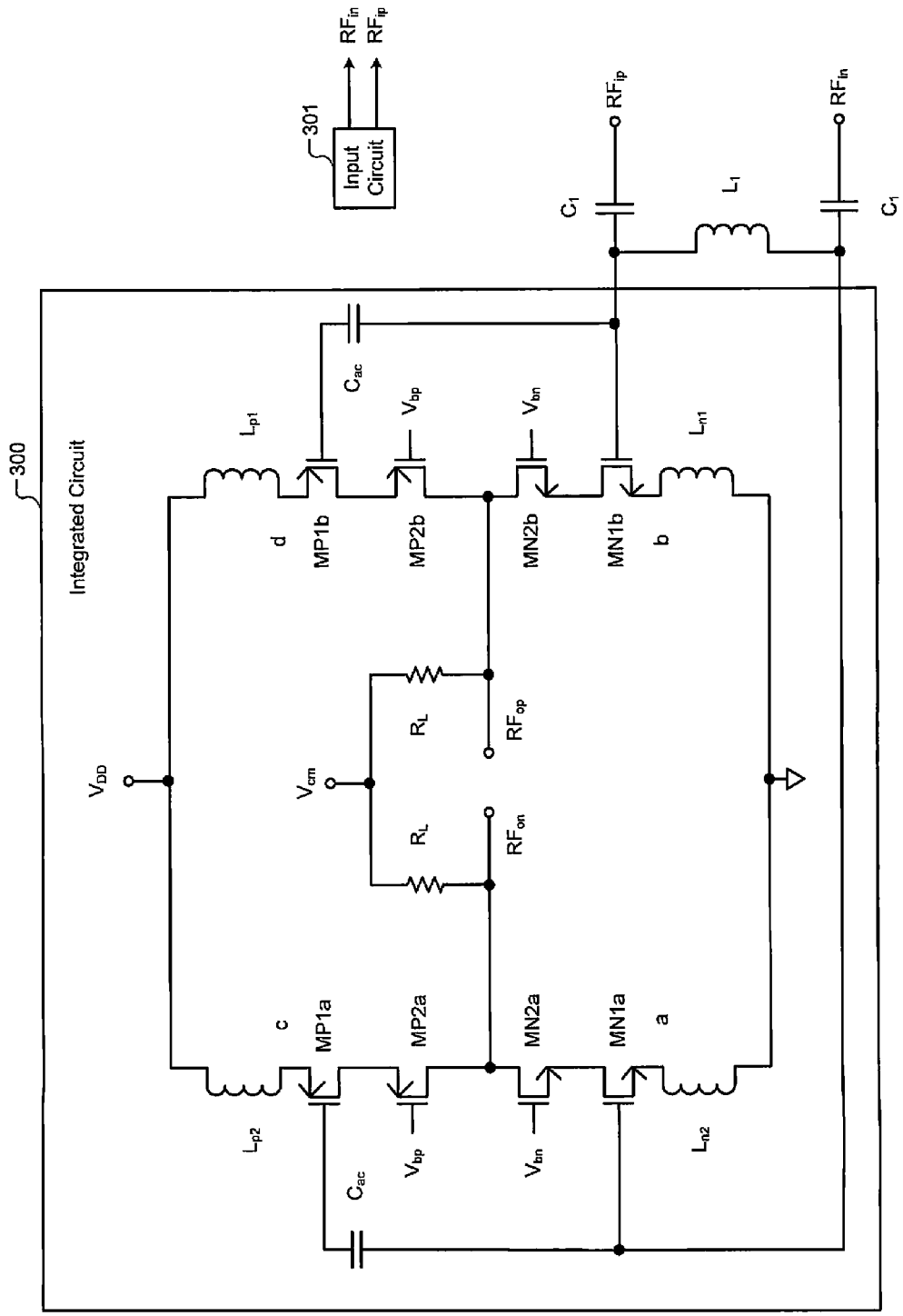
FIG. 12 depicts an IC comprising a differential push-pull LNA that uses the area-efficient implementation of inductances.

Referring now to FIG. 12, an IC 300 comprising a differential push-pull LNA according to the present disclosure is shown. The inductances $L_{p1}$ and $L_{p2}$ are implemented by the outer loop 204 shown in FIG. 7D. The inductances $L_{n1}$ and $L_{n2}$ are implemented by the inner loop 206 shown in FIG. 7D. Typically, components external to the IC 300 are used to match the input impedance of the differential push-pull LNA to an external input circuit 301 that inputs $RF_{ip}$ and $RF_{in}$ to the IC 300. For example, a shunt inductance L1 and a pair of series capacitances C1 external to the IC 300 may be used.

The two PMOS sections of the differential push-pull LNA comprising transistors MP1a, MP2a, MP1b, and MP2b may be called a push stage of the differential push-pull LNA. The two NMOS sections of the differential push-pull LNA 240 comprising transistors MN1a, MN2a, MN1b, and MN2b may be called a pull stage of the differential push-pull LNA.

Figure 13:
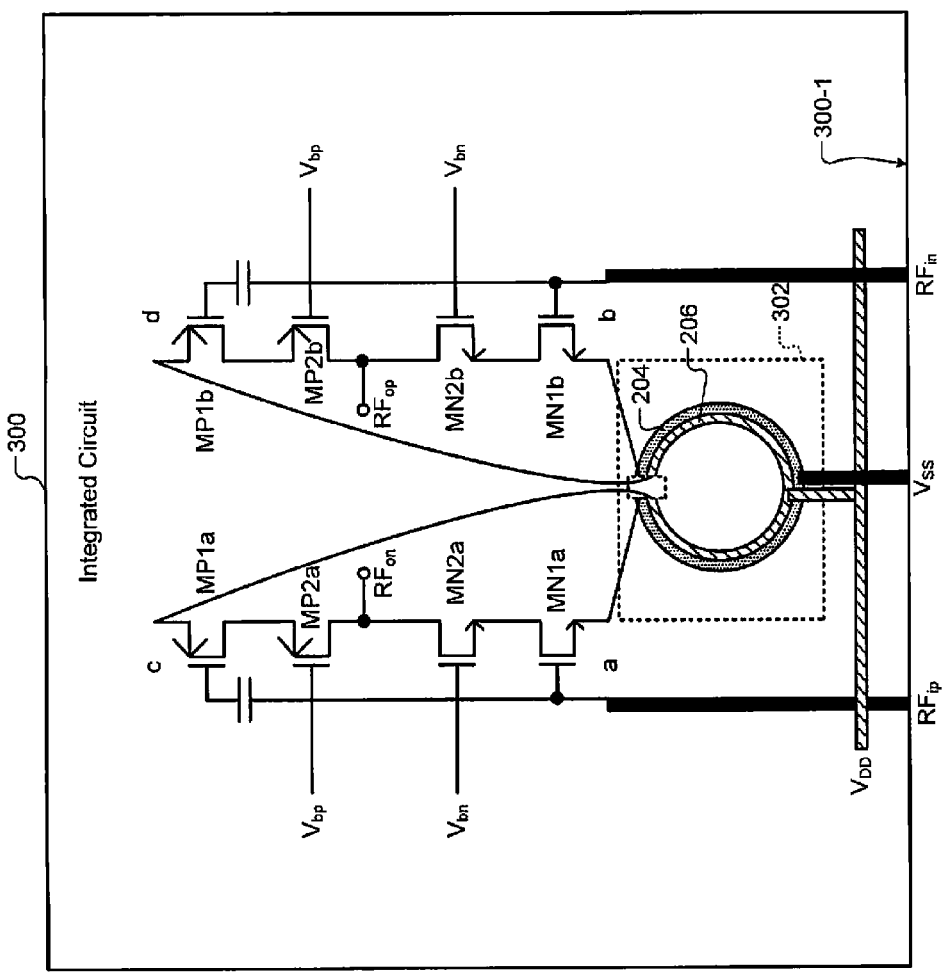
FIG. 13 depicts layout of the area-efficient inductances in the IC of FIG. 12.

Referring now to FIG. 13, a layout of the IC 300 is shown. $V_{DD}$ and $V_{ss}$ are applied to center points of the widths of the concentric loops 204 and 206 as shown, respectively. A transformer 302 comprising the concentric loops 204 and 206 is positioned adjacent to an edge 300-1 of the IC 300. The edge 300-1 is closer to the amplification stage than to the push-pull stage of the differential push-pull LNA. Thus, the transformer 302 is positioned between the amplification stage of the differential push-pull LNA and the edge 300-1.

Figure 14:
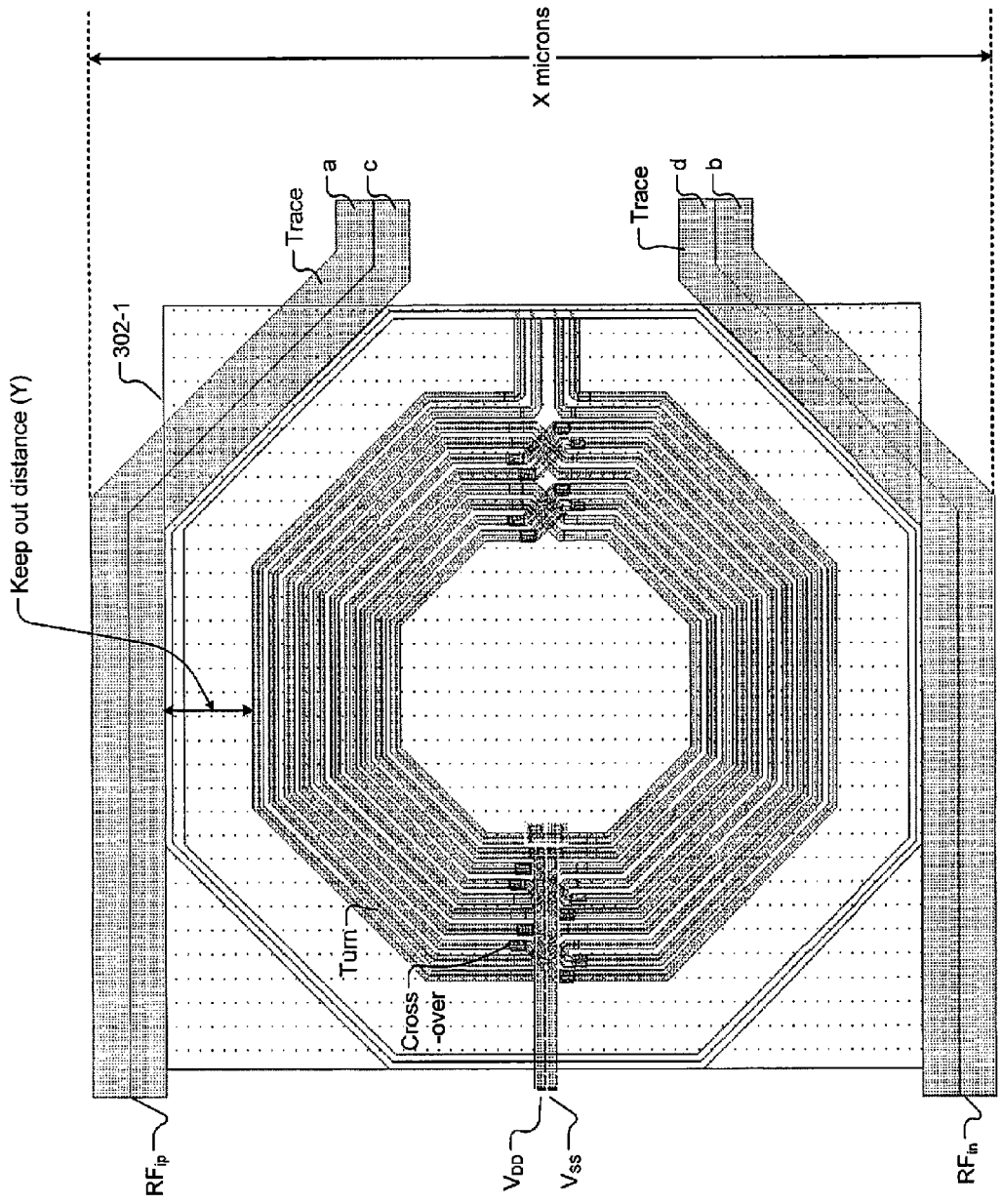
FIG. 14 depicts layout of the area-efficient inductances and traces used to feed input signals to the differential push-pull LNA in an IC.

Referring now to FIG. 14, a first example of the transformer 302 is shown. In the first example, a transformer 302-1 is a two-element transformer that is used to implement the concentric loops 204 and 206. The input lines or traces that feed $RF_{in}$ and $RF_{ip}$ into the differential push-pull LNA of the IC 300 are routed around the transformer 302-1 as shown. Specifically, a distance is maintained between the traces and the concentric loops 204 and 206. The distance is called a keep out distance.

The distance is kept to ensure that signals via the traces do not affect the performance of the concentric loops 204 and 206. In other words, the distance ensures that there is no coupling between the traces and the concentric loops 204 and 206. The distance may be of the order of a few tens of microns. When the IC 300 comprises N differential push-pull LNAs (e.g., in multi-band transceivers), where N is an integer greater than 1, N times the keep out distance is used in the IC 300.

Figure 15:
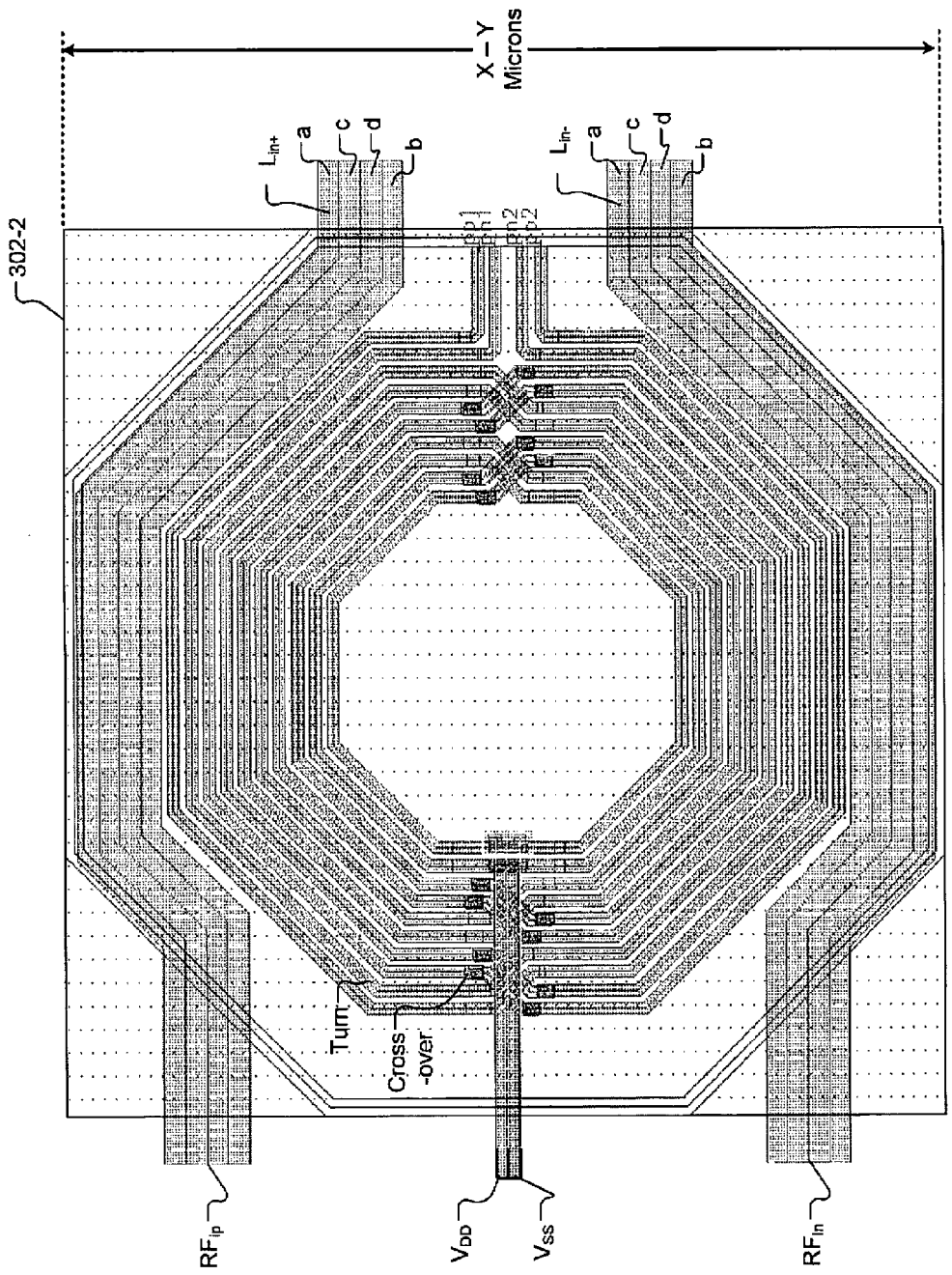
FIG. 15 depicts layout of the area-efficient inductances and traces that are proximate to the area-efficient inductances in an IC.

Referring now to FIG. 15, a second example of the transformer 302 is shown. In the second example, a transformer 302-2 is a three-element transformer. Two of the three elements are used to implement the concentric loops 204 and 206. A third element is used to implement the traces that feed $RF_{in}$ and $RF_{ip}$ into the differential push-pull LNA of the IC 300.

Effectively, the traces are routed adjacent and proximate to the concentric loops 204 and 206 without the keep out distance separating the traces from the concentric loops 204 and 206. Thus, the keep out distance is eliminated, and area in the IC 300 is freed for other uses. The freeing of area by eliminating the keep out distance is called compacting input lines or traces to the source degenerating inductors. The compacting reduces inductance values and lowers Q factors of the inductances implemented by the transformer 302-2.

In FIGS. 14 and 15, for example only, each loop comprises more than one turn of wire. Typically, an IC may have multiple metal layers. Crossovers connect the turns in different metal layers. When a loop includes a single turn of wire, the turn is implemented in one of the metal layers of the IC, and a crossover is unnecessary. Regardless of the number of turns, metallic substances in the area below and surrounding the turns is cleared to avoid interference with inductive properties of the loops due to coupling.

Figure 16:
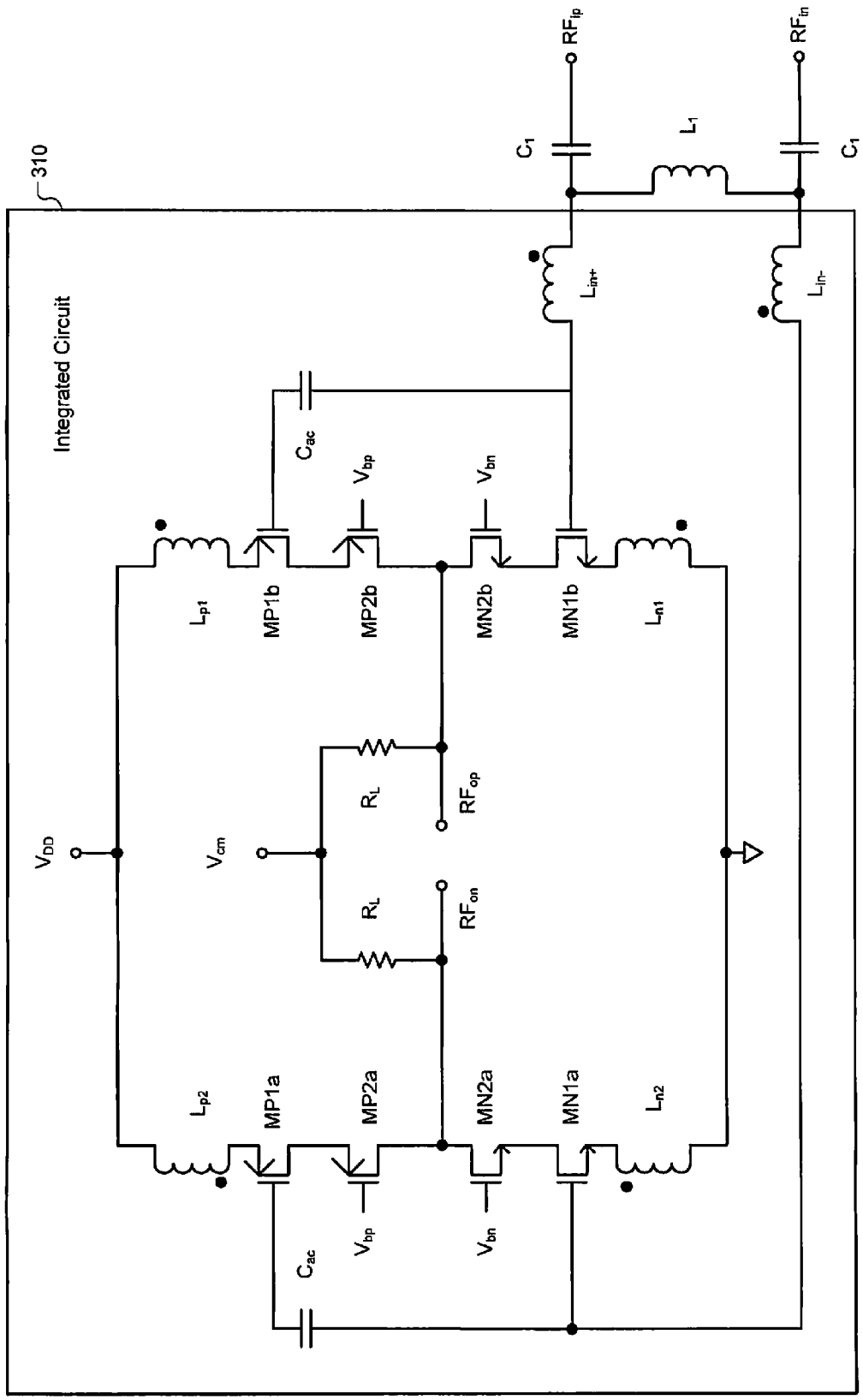
FIG. 16 depicts an IC comprising a differential push-pull LNA that includes the area-efficient inductances and traces as shown in FIG. 15.

Referring now to FIG. 16, an IC 310 comprises a differential push-pull LNA that uses the three-element transformer 302-2 shown in FIG. 15. The transformer 302-2 shown in FIG. 15 implements the inductances $L_{n1}$, $L_{n2}$, $L_{p1}$, $L_{p2}$, $L_{in+}$, and $L_{in-}$ as shown in FIG. 16. The traces used to feed $RF_{in}$ and $RF_{ip}$ into the differential push-pull LNA are replaced by elements of the transformer 302-2. The elements of the transformer 302-2 that replace the traces are identified as inductances $L_{in+}$ and $L_{in-}$ in FIG. 15. The inductances $L_{in+}$ and $L_{in-}$ are schematically shown in FIG. 16.

A coupling exists between the inductances $L_{in+}$ and $L_{in-}$ and the source degenerating inductances of the differential push-pull LNA. The coupling can be beneficial when the inductances are arranged with proper polarities as shown in FIG. 16.

The transformer 302-2 comprising the concentric loops 204 and 206 and the traces is positioned adjacent to the edge of the IC 310 that is closer to the amplification stage than to the push-pull stage. In other words, the transformer 302-2 is positioned between the amplification stage of the differential push-pull LNA and the edge of the IC 310 that is closer to the amplification stage than to the push-pull stage.

Figure 17:
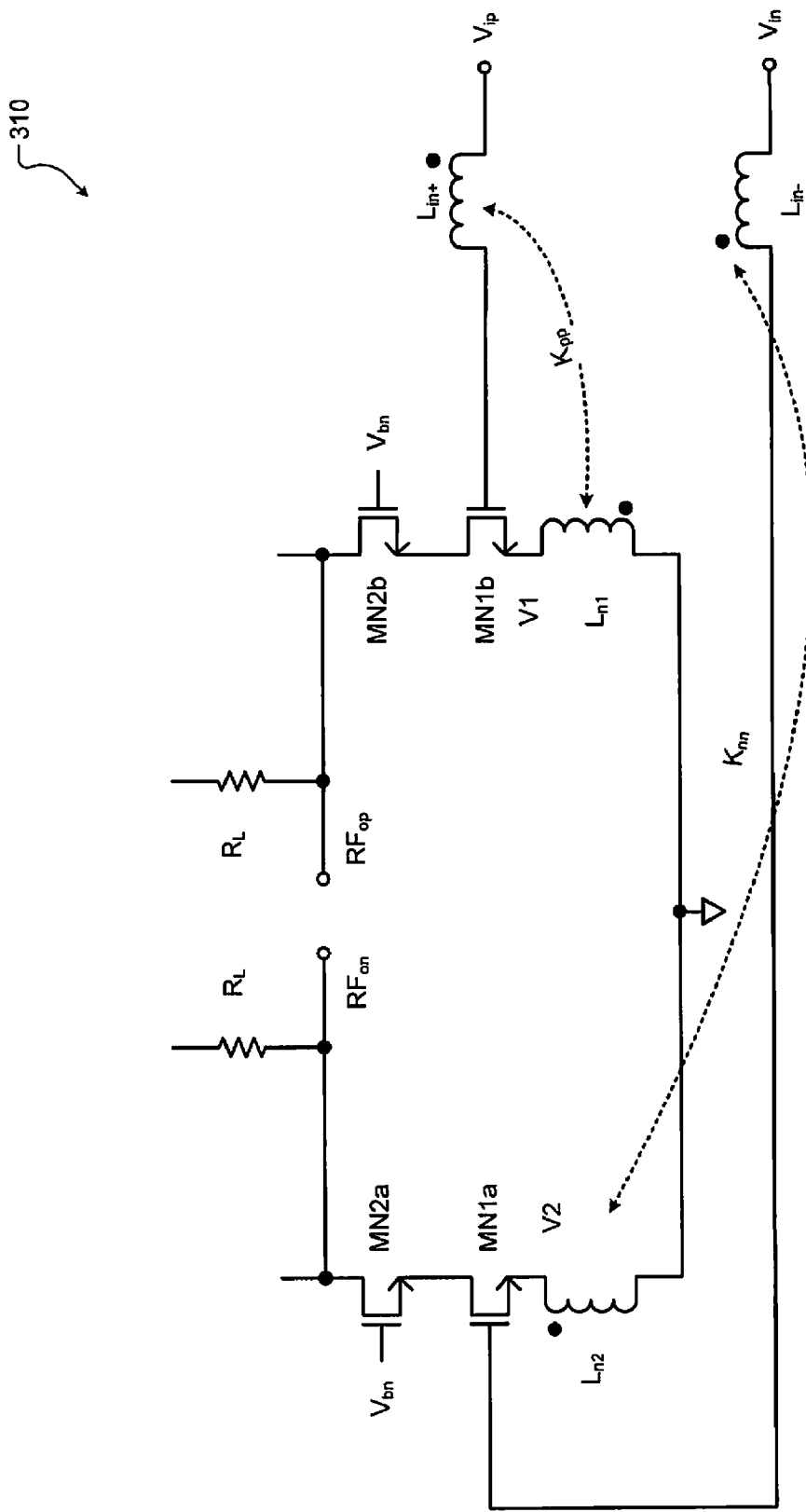
FIG. 17 depicts coupling between the traces and the area-efficient inductances of FIG. 16.

Referring now to FIG. 17, an example of coupling between the inductances $L_{in+}$ and $L_{in-}$ and the source degenerating inductances $L_{n1}$ and $L_{n2}$ is shown. As $V_{ip}$ increases, V1 decreases, and V2 increases due to inductor coupling ($K_{pp}$ and $K_{nn}$). Accordingly, the coupling boosts the $V_{GS}$ across the transistor MN1a. Similar result obtains with opposite polarities with respect to $V_{in}$. Thus, the coupling between the inductances $L_{in+}$ and $L_{in-}$ and the source degenerating inductances increases the gain of the LNA. Consequently, the coupling improves noise filtering. Additionally, the coupling increases Q factors of impedance matching circuits.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:
1. An amplifier integrated circuit (IC), comprising:
a push-pull configuration including a push stage and a pull stage;

a first loop of wire configured to form a first degeneration inductance of the push stage;

a second loop of wire configured to form a first degeneration inductance of the pull stage, wherein the first loop and the second loop are concentric;

a first trace configured to input a first signal to an amplification stage, wherein the first trace is adjacent and proximate to a first portion of the first loop; and a second trace configured to input a second signal to the amplification stage, wherein the second trace is adjacent and proximate to a second portion of the first loop, and wherein the second portion is arranged across from and opposite to the first portion.

2. The amplifier IC of claim 1, wherein the first loop, the second loop, the first trace, and the second trace are arranged between the amplification stage and an edge of the amplifier IC.

3. The amplifier IC of claim 1, wherein:
each of the first loop and the second loop has a shape of a circle, a spiral, or a polygon; and
the first loop has a greater area than the second loop.

4. The amplifier IC of claim 1, wherein the pull stage includes metal-oxide semiconductor field-effect transistors (MOSFETs) of a first polarity, and wherein the push stage includes MOSFETs of a second polarity that is opposite to the first polarity.

5. A transceiver comprising:
the amplifier IC of claim 1,
wherein the transceiver includes a receiver, wherein the receiver includes at least one low-noise amplifier (LNA), and
wherein the at least one LNA includes the amplification stage and the push-pull configuration.

6. A communication device comprising the transceiver of claim 5.

7. An amplifier integrated circuit (IC), comprising:
a push-pull configuration including a push stage and a pull stage;
a first loop of wire configured to form (i) a first degeneration inductance and (ii) a second degeneration inductance of the push stage; and
a second loop of wire configured to form (i) a first degeneration inductance and (ii) a second degeneration inductance of the pull stage,
wherein the first loop and the second loop are concentric,
wherein the first loop is connected to a common potential, and
wherein the second loop is connected to a supply voltage.

8. An amplifier integrated circuit (IC), comprising:
a push-pull configuration including a push stage and a pull stage;
a first loop of wire configured to form a first degeneration inductance of the push stage; and
a second loop of wire configured to form a first degeneration inductance of the pull stage, wherein the first loop and the second loop are concentric;
wherein each of the first loop and the second loop has a first terminal and a second terminal;
wherein the pull stage comprises a first transistor having (i) a first terminal configured to connect to the first terminal of the first loop, (ii) a second terminal, and (iii) a control terminal;

wherein the push stage comprises a second transistor having (i) a first terminal configured to connect to the first terminal of the second loop, (ii) a second terminal, and (iii) a control terminal; and
wherein the second terminal of the first loop and the second terminal of the second loop are configured to connect to a common potential and a supply voltage, respectively.

9. The amplifier IC of claim 8, wherein:
the pull stage further comprises a third transistor having (i) a first terminal configured to connect to the second terminal of the first transistor, and (ii) a second terminal; and
the push stage further comprises a fourth transistor having (i) a first terminal configured to connect to the second terminal of the third transistor, and (ii) a second terminal configured to connect to the second terminal of the second transistor.

10. The amplifier IC of claim 9, further comprising:
an input inductance having (i) a first terminal configured to receive an input signal, and (ii) a second terminal configured to connect to the control terminal of the first transistor; and
a capacitance having (i) a first terminal configured to connect to the control terminal of the first transistor, and (ii) a second terminal configured to connect to the control terminal of the second transistor.

11. An amplifier integrated circuit (IC), comprising:
a push-pull configuration including a push stage and a pull stage;
a first loop of wire configured to form a first degeneration inductance of the push stage; and
a second loop of wire configured to form a first degeneration inductance of the pull stage, wherein the first loop and the second loop are concentric;
wherein each of the first loop and the second loop has a first terminal and a second terminal;
wherein the pull stage comprises:
a first transistor having (i) a first terminal configured to connect to the first terminal of the first loop, (ii) a second terminal, and (iii) a control terminal configured to receive a first input signal; and
a second transistor having (i) a first terminal configured to connect to the second terminal of the first loop, (ii) a second terminal, and (iii) a control terminal configured to receive a second input signal; and
wherein the push stage comprises:
a third transistor having (i) first terminal configured to connect to the first terminal of the second loop, (ii) a second terminal, and (iii) a control terminal; and
a fourth transistor having (i) a first terminal configured to connect to the second terminal of the second loop, (ii) a second terminal, and (iii) a control terminal.

12. The amplifier IC of claim 11, wherein:
the pull stage further comprises:
a fifth transistor having (i) a first terminal configured to connect to the second terminal of the first transistor, and(ii) a second terminal; and
a sixth transistor having (i) a first terminal configured to connect to the second terminal of the second transistor, and (ii) a second terminal; and
the push stage further comprises:
a seventh transistor having (i) a first terminal configured to connect to the second terminal of the fifth transistor, and (ii) a second terminal configured to connect to the second terminal of the third transistor; and an eighth transistor having (i) a first terminal configured to connect to the second terminal of the sixth transistor, and (ii) a second terminal configured to connect to the second terminal of the fourth transistor.

13. The amplifier IC of claim 12, further comprising:

a first capacitance having (i) a first terminal configured to connect to the control terminal of the first transistor, and (ii) a second terminal configured to connect to the control terminal of the third transistor; and a second capacitance having (i) a first terminal configured to connect to the control terminal of the second transistor, and (ii) a second terminal configured to connect to the control terminal of the fourth transistor.

* * * * *